United States Patent
Ma et al.

(10) Patent No.: US 11,054,859 B2
(45) Date of Patent: Jul. 6, 2021

(54) DISPLAY PANEL AND DISPLAY DEVICE

(71) Applicant: WuHan TianMa Micro-electronics CO., LTD, Wuhan (CN)

(72) Inventors: Yangzhao Ma, Wuhan (CN); Ruiyuan Zhou, Wuhan (CN); Yingjie Chen, Wuhan (CN)

(73) Assignee: WuHan TianMa Micro-electronics CO., LTD, Wuhan (CN)

( * ) Notice: Subject to any disclaimer, the term of this patent is extended or adjusted under 35 U.S.C. 154(b) by 13 days.

(21) Appl. No.: 16/721,699

(22) Filed: Dec. 19, 2019

(65) Prior Publication Data

US 2021/0064087 A1 Mar. 4, 2021

(30) Foreign Application Priority Data

Aug. 27, 2019 (CN) .......................... 201910795541.0

(51) Int. Cl.
*G06F 1/16* (2006.01)
*G06F 1/18* (2006.01)
*H01L 27/32* (2006.01)

(52) U.S. Cl.
CPC .......... *G06F 1/1637* (2013.01); *G06F 1/1686* (2013.01); *G06F 1/189* (2013.01); *H01L 27/326* (2013.01); *H01L 27/3234* (2013.01); *H01L 27/3276* (2013.01)

(58) Field of Classification Search
CPC ....... G06F 1/1637; G06F 1/1686; G06F 1/189
See application file for complete search history.

(56) References Cited

U.S. PATENT DOCUMENTS

| 9,477,353 | B2* | 10/2016 | Kim | ................ | G06F 3/0445 |
| 10,879,330 | B1* | 12/2020 | Cui | ................ | H04M 1/0264 |
| 2008/0284929 | A1* | 11/2008 | Kimura | ................ | G02F 1/1368 |
| | | | | | 349/38 |
| 2013/0099692 | A1* | 4/2013 | Chaji | ................ | G09G 3/3283 |
| | | | | | 315/224 |
| 2019/0347985 | A1* | 11/2019 | Shaeffer | ................ | H05B 45/20 |
| 2020/0105843 | A1* | 4/2020 | Baek | ................ | H01L 51/5209 |

FOREIGN PATENT DOCUMENTS

CN 108269840 A 7/2018

* cited by examiner

*Primary Examiner* — Douglas M Menz
(74) *Attorney, Agent, or Firm* — Christensen O'Connor Johnson Kindness PLLC

(57) ABSTRACT

A display panel and a display device are provided. The display panel includes first display region and second display region at least partially surrounding the first display region. A density of the pixel units in the first display region is smaller than in the second display region. In the first display region, along a row direction, the first pixel unit in the first pixel unit row is between two adjacent second pixel units in the second pixel unit row, and the second pixel unit in the second pixel unit row is between two adjacent first pixel units in the first pixel unit row. The first pixel circuit and the second pixel circuit are connected to a same first or second signal line. The first pixel unit connected to the first pixel circuit and the second pixel unit connected to the second pixel circuit are located in adjacent rows or columns.

20 Claims, 15 Drawing Sheets

DISPLAY PANEL AND DISPLAY DEVICE

CROSS-REFERENCE TO RELATED APPLICATIONS

The present application claims priority to Chinese Patent Application No. 201910795541.0, filed on Aug. 27, 2019, the content of which is incorporated herein by reference in its entirety.

TECHNICAL FIELD

The present disclosure relates to the field of display technologies, and particularly, to a display panel and a display device.

BACKGROUND

With the increasing requirement for diversified use of a display device by users and the design requirements of a high screen to body ratio of the display device, there has appeared a design of a down-screen camera, that is, a photosensitive element such as a camera is embedded at a backlight side of a display panel, so as to increase the screen to body ratio of the display device to a greater extent. However, by using the design of the down-screen camera, on the basis of increasing the screen to body ratio of the display device, there is a high requirement for the light transmittance and the display effect at the position where the photosensitive element is provided in the display panel.

SUMMARY

In view of this, the present disclosure provides a display panel and a display device for ensuring the display effect at a position where the photosensitive element is provided in the display panel on the basis of improving the light transmittance of the position.

In a first aspect of the present disclosure, a display panel is provided. The organic light-emitting display panel includes a display region and a non-display region. The display region includes a plurality of pixel units arranged in an array along a row direction and a column direction. The display region includes a first display region and a second display region at least partially surrounding the first display region. A density of pixel units in the first display region is smaller than a density of pixel units in the second display region. The plurality of pixel units includes a plurality of first pixel unit rows and a plurality of second pixel unit rows that are alternately arranged along the column direction and located in the first display region. Each of the plurality of first pixel unit rows includes a plurality of first pixel units arranged along the row direction, and each of the plurality of second pixel unit rows includes a plurality of second pixel units arranged along the row direction. Along the row direction, at least one of the plurality of first pixel units is located between two adjacent second pixel units of the plurality of second pixel units, and at least one of the plurality of second pixel units is located between two adjacent first pixel units of the plurality of first pixel units. The first display region further includes a plurality of first signal lines extending along the row direction and arranged along the column direction, and a plurality of second signal lines extending along the column direction and arranged along the row direction. The plurality of first signal lines and the plurality of second signal lines intersect to define a plurality of first pixel circuits and a plurality of second pixel circuits, each of the plurality of first pixel circuits is electrically connected to one of the plurality of first pixel units, and each of the plurality of second pixel circuits is electrically connected to one of the plurality of second pixel units. At least one of the plurality of first pixel circuits and at least one of the plurality of second pixel circuits are electrically connected to a same one of the plurality of first signal lines and different ones of the plurality of second signal lines, at least one of the plurality of first pixel units electrically connected to the at least one of the plurality of first pixel circuits and at least one of the plurality of second pixel units electrically connected to the at least one of the plurality of second pixel circuits are located in adjacent rows. Alternatively, at least one of the plurality of first pixel circuits and at least one of the plurality of second pixel circuits are electrically connected to a same one of the plurality of second signal lines and different ones of the plurality of first signal lines, at least one of the plurality of first pixel units electrically connected to the at least one of the plurality of first pixel circuits and at least one of the plurality of second pixel units electrically connected to the at least one of the plurality of second pixel circuits are located in adjacent columns.

In a second aspect of the present disclosure, a display device is provided. The display device includes the above display panel.

BRIEF DESCRIPTION OF DRAWINGS

In order to better illustrate technical solutions of embodiments of the present disclosure, the drawings to be used in the embodiments will be briefly described below. It is appreciated that, the drawings in the following description show non-limiting and non-exhaustive embodiments of the present disclosure. Like reference numerals refer to like parts throughout the various views unless otherwise specified.

DESCRIPTION OF EMBODIMENTS

In order to better understand technical solutions of the present disclosure, the embodiments of the present disclosure are described in detail with reference to the drawings.

It should be clear that the described embodiments are representative and non-limiting embodiments of the present disclosure, rather than all of the embodiments. In the following description, numerous specific details are set forth to provide a thorough understanding of the representative embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

The terms used in the embodiments of the present disclosure are for the purpose of describing the representative embodiments, rather than limiting the present disclosure. The terms "a", "an", "the" and "said" in a singular form in an embodiment of the present disclosure and the attached claims are also intended to include plural forms thereof, unless noted otherwise. Reference throughout this specification to "an embodiment" or "some embodiments" means that a particular feature, structure, or characteristic described in connection with the embodiment is included in at least one embodiment of the present invention. Thus, the appearances of the phrases "In some embodiments" or "in an embodiment" in various places throughout this specification are not necessarily all referring to the same example. Furthermore, the particular features, structures, or characteristics of embodiments may be combined in any suitable manner in one or more examples.

It should be understood that the term "and/or" used in the context of the present disclosure is to describe a correlation relation of related objects, indicating that there may be three relations, e.g., A and/or B may indicate only A, both A and B, and only B. In addition, the symbol "/" in the context generally indicates that the relation between the objects in the front and at the back of "/" is an "or" relationship.

It should be understood that although the terms 'first' and 'second' may be used in the present disclosure to describe display regions, these display regions should not be limited to these terms. These terms are used to distinguish the display regions from each other. For example, without departing from the scope of the embodiments of the present disclosure, a first display region may also be referred to as a second display region. Similarly, the second display region may also be referred to as the first display region.

Figure 1:
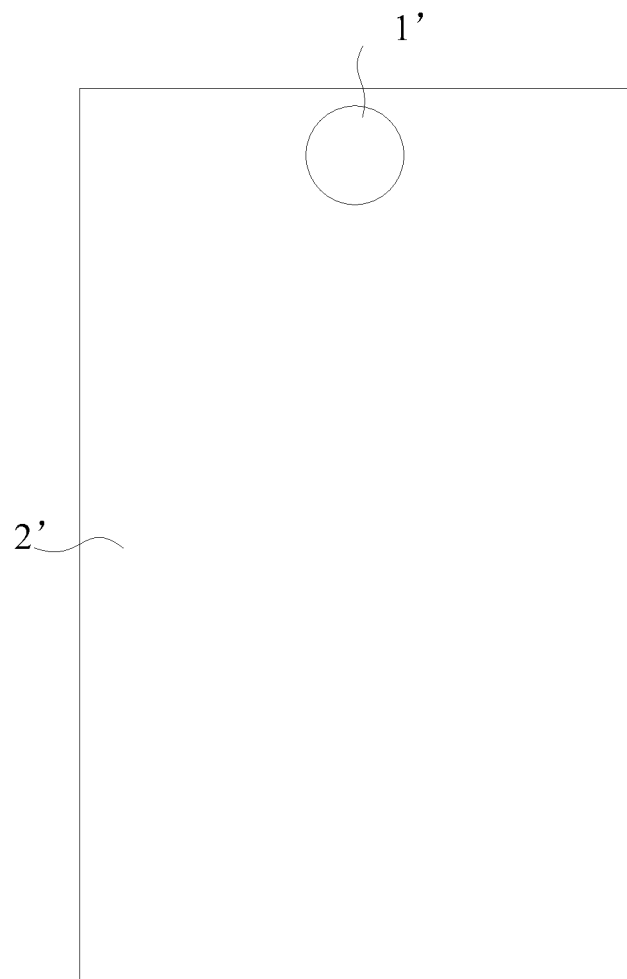
FIG. 1 is a top view of a display panel in the related art.
Figure 2:
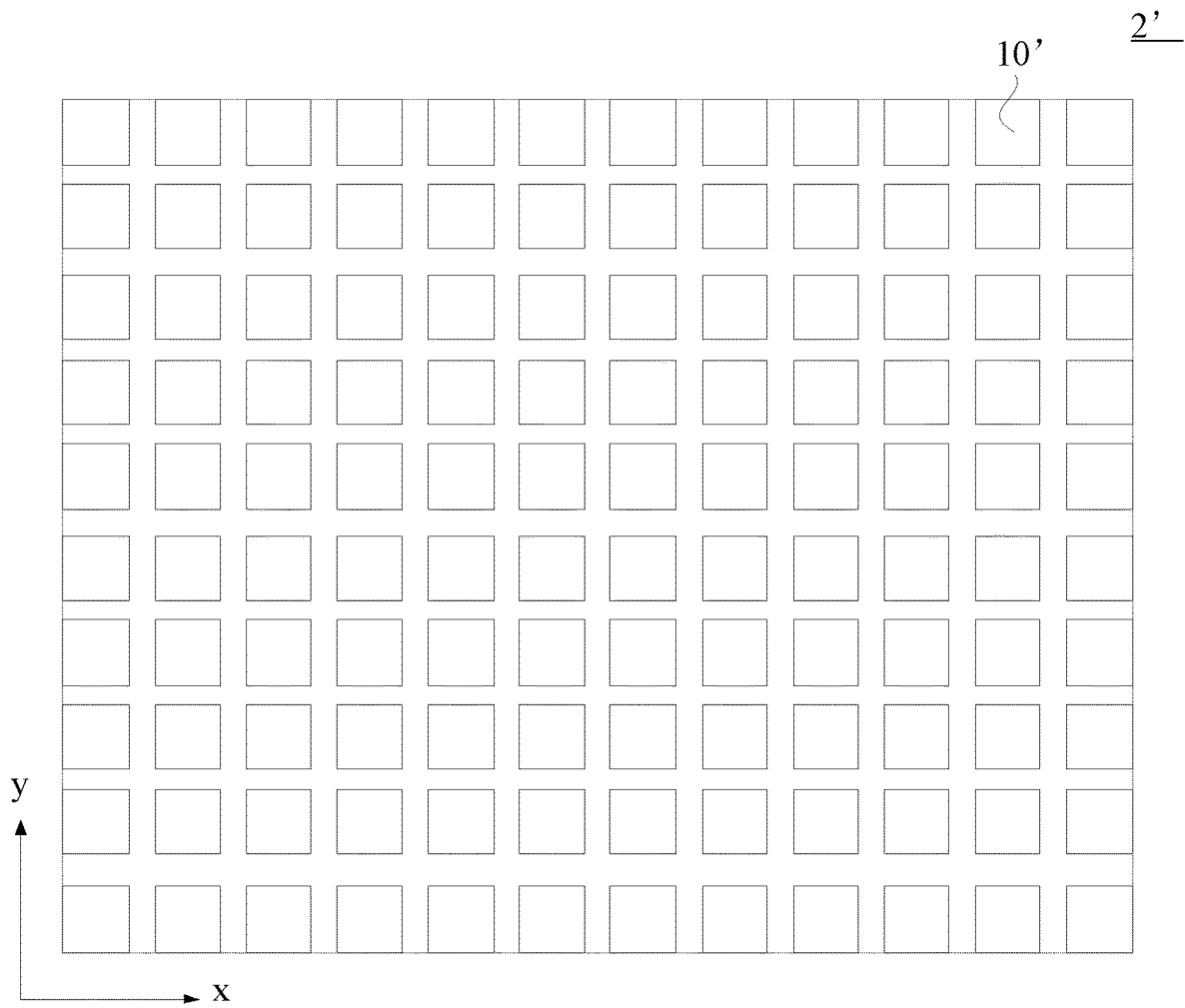
FIG. 2 is a schematic diagram showing a pixel arrangement in a normal display region in FIG. 1.
Figure 3:
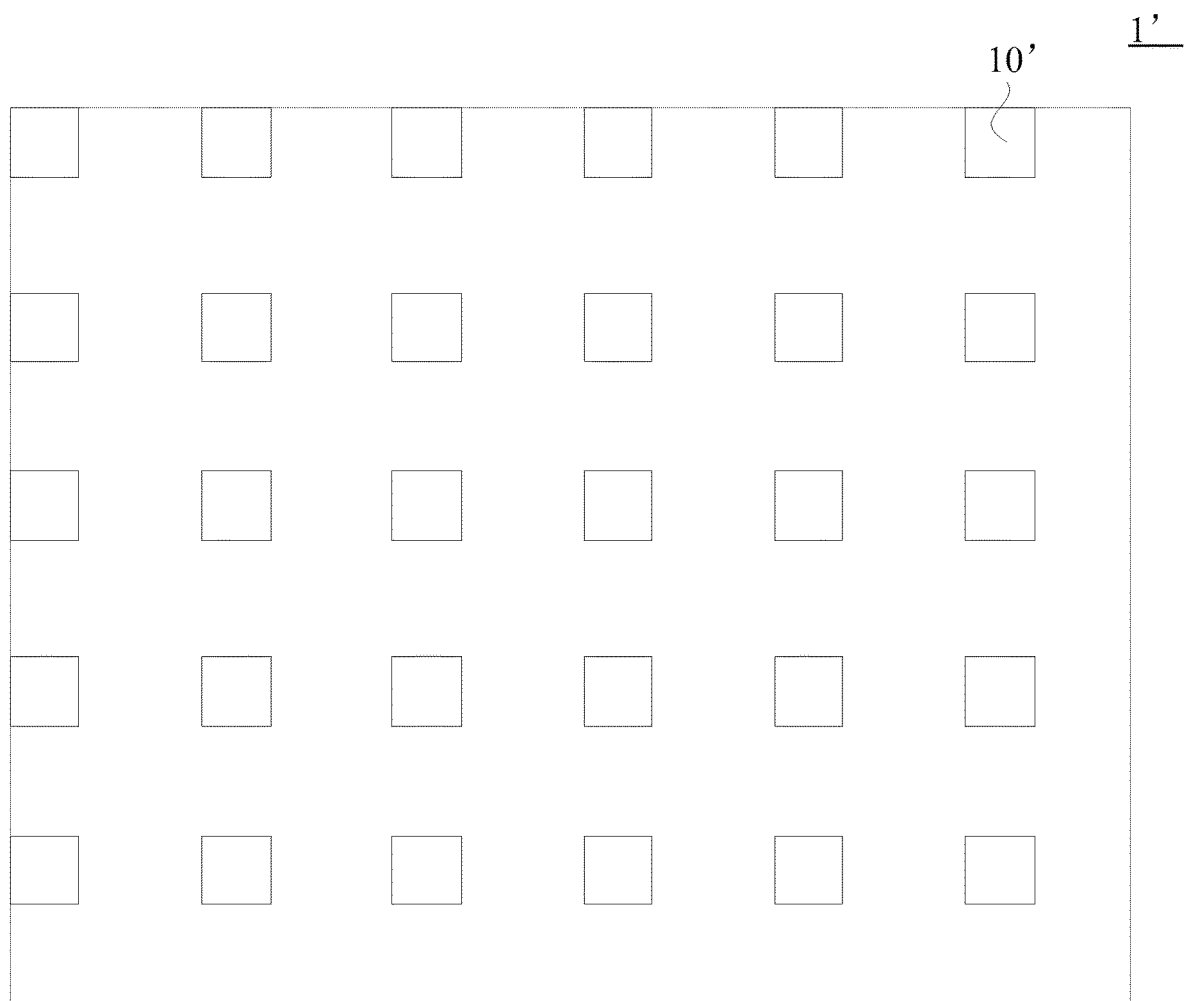
FIG. 3 is a schematic diagram showing a pixel arrangement of a semi-transparent region in FIG. 1.
Figure 4:
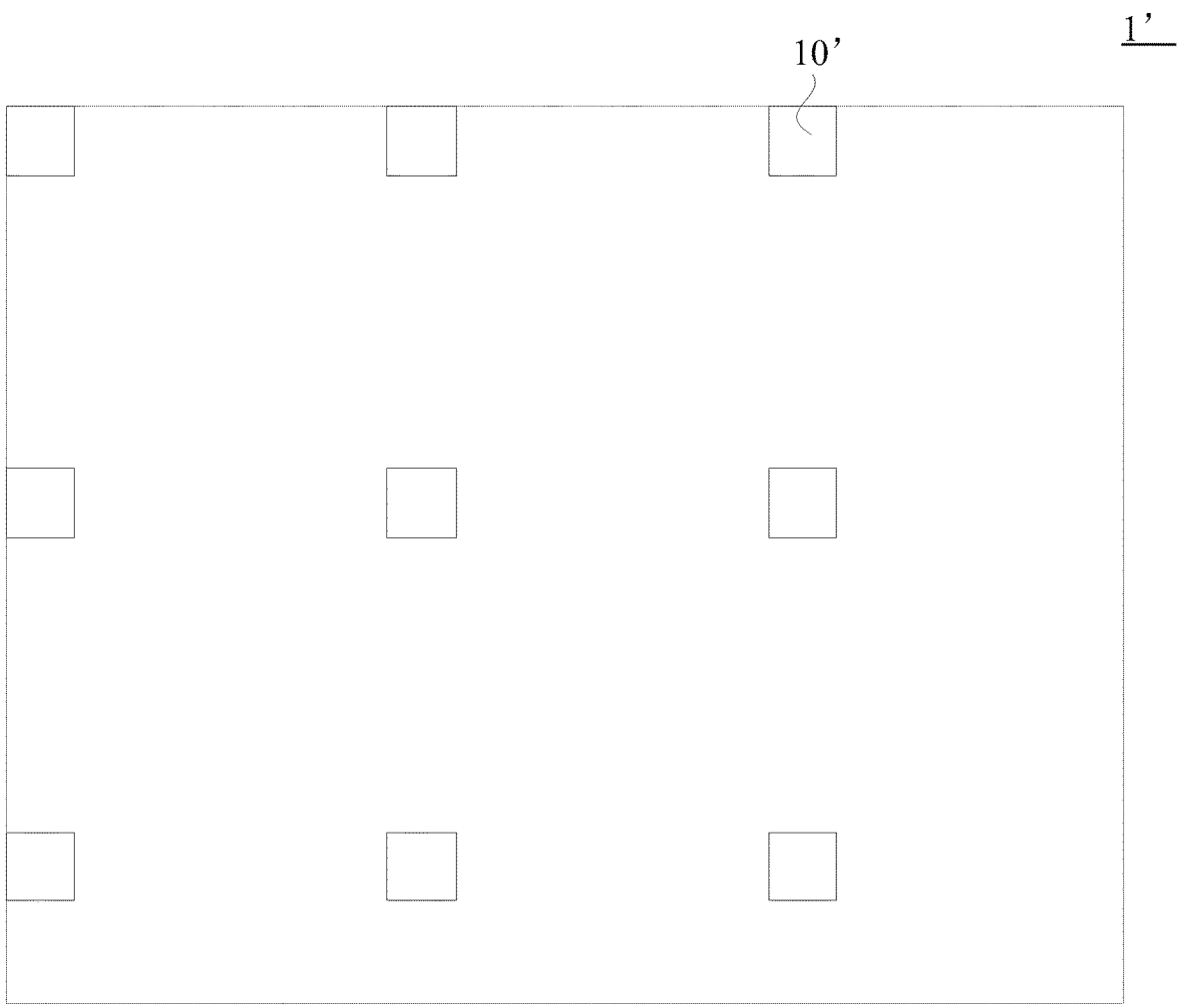
FIG. 4 is a schematic diagram showing another pixel arrangement of a semi-transparent region in FIG. 1.

In a process of implementing the embodiments of the present disclosure, the inventors have found that in order to improve the light transmittance at the position where the photosensitive element is provided in a display panel, a manner of reducing the pixel per inch (Pixels Per Inch, PPI) at the above position is generally adopted. FIG. 1 is a top view of a display panel in the related art, a display region of the display panel includes a semi-transparent region 1' and a normal display region 2'. Subsequently, the photosensitive element may be provided correspondingly in the semi-transparent region 1', so that the display panel has functions such as camera shooting. Referring to FIG. 2 as an example, taking the pixel arrangement manner in the normal display region 2', the pixel unit 10' is arranged in an array along a row direction x and a column direction y. In order to increase the light transmittance of the semi-transparent region 1' of FIG. 1, when a pixel arrangement manner of the semi-transparent region 1' is provided, it is proposed to remove a row and a column of the pixel units 10' shown in FIG. 2 every row and column apart to form a pixel arrangement of the semi-transparent region 1' shown in FIG. 3. Since the light transmittance of the semi-transparent region 1' shown in FIG. 3 is still lower, in order to further increase the light transmittance of the semi-transparent region 1', on the basis of the pixel arrangement shown in FIG. 3, if the pixel units 10' are continuously removed as above to form a pixel arrangement shown in FIG. 4, the display screen of the semi-transparent region 1' may have a distinct granular sensation, thereby negatively affecting the display effect.

Figure 5:
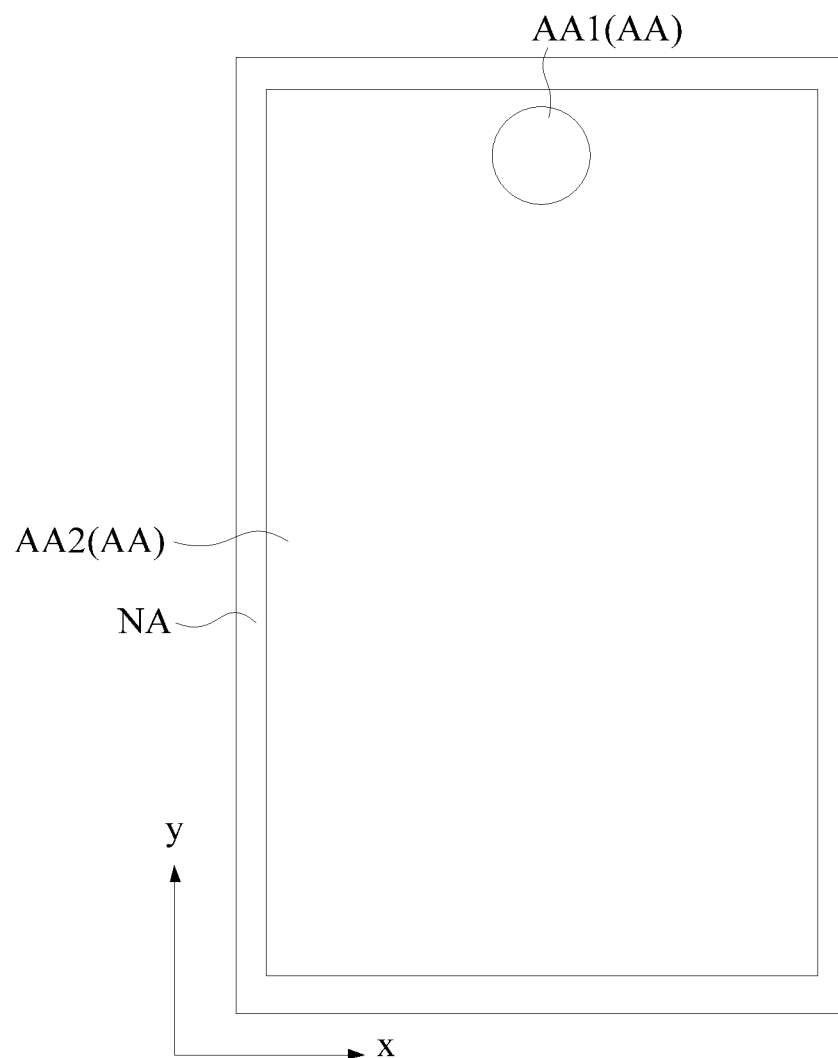
FIG. 5 is a schematic diagram showing a display panel according to a representative embodiment of the present disclosure.

Based on this, the present disclosure provides a display panel. FIG. 5 is a schematic diagram showing a display panel according to one example of a representative embodiment of the present disclosure. As shown in FIG. 5, the display panel includes a display region AA and a non-display region NA. The display region AA includes a first display region AA1 and a second display region AA2. The second display region AA2 at least partially surrounds the first display region AA1.

Figure 6:
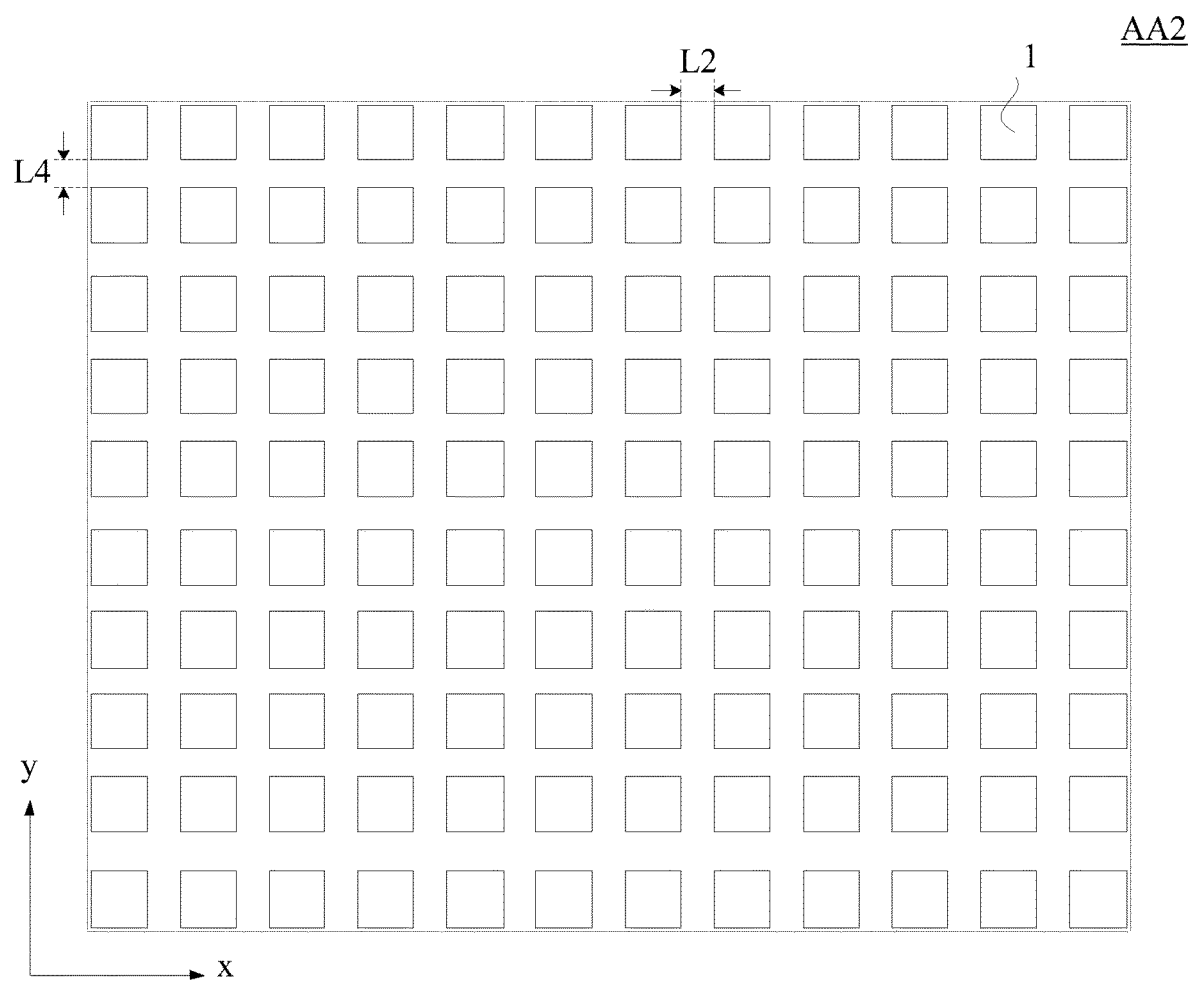
FIG. 6 is an enlarged schematic diagram showing a partial region of the second display region in FIG. 5.
Figure 7:
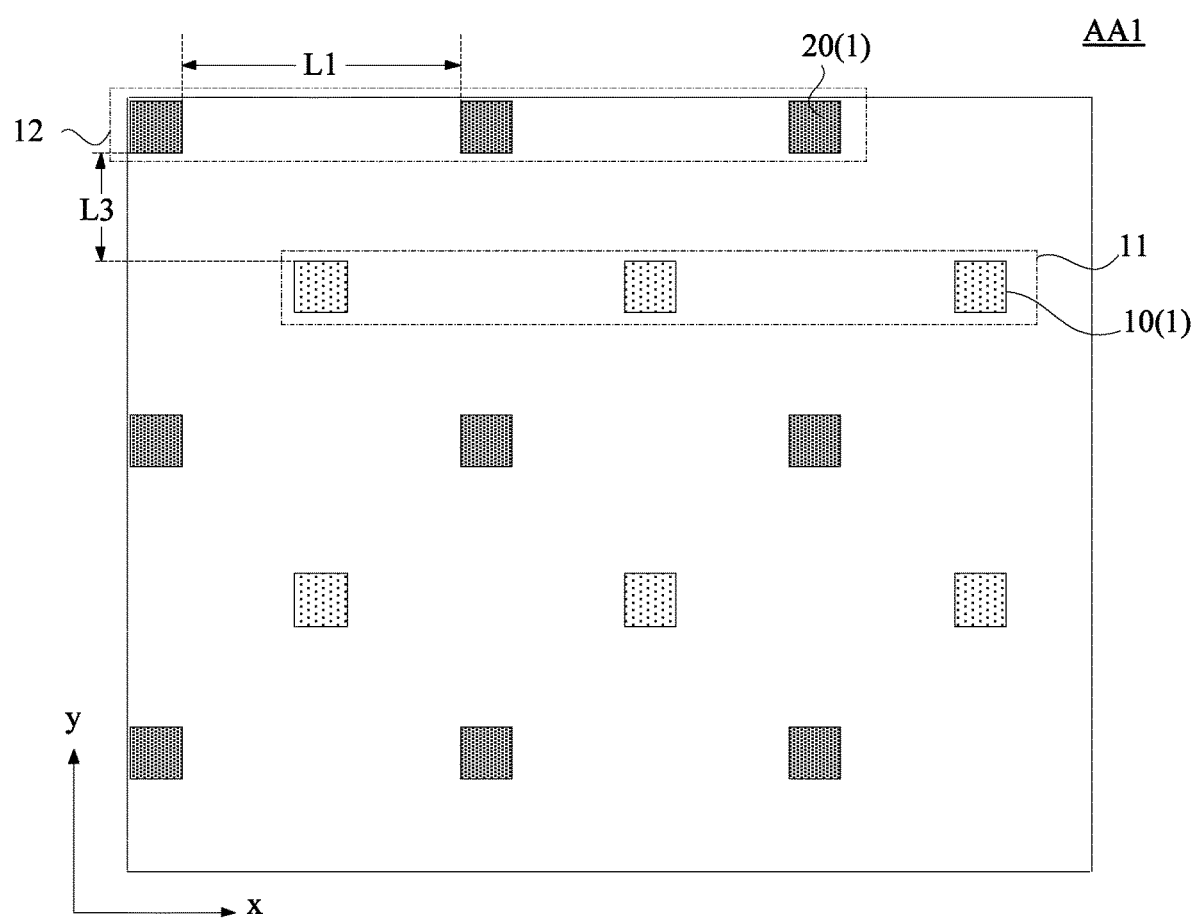
FIG. 7 is an enlarged schematic diagram showing a partial region of the first display region in FIG. 5.

FIG. 6 is an enlarged schematic diagram showing a partial region of the second display region in FIG. 5, and FIG. 7 is an enlarged schematic diagram showing a partial region of the first display region in FIG. 5. As shown in FIGS. 6-7, an area of the second display region AA2 shown in FIG. 6 is the same as an area of the first display region AA1 shown in FIG. 7. As can be seen from FIGS. 6-7, the first display region AA1 and the second display region AA2 each include a plurality of pixel units 1 arranged in an array along a row direction x and a column direction y. In a same area, a number of the pixel units 1 in the first display region AA1 is smaller than a number of the pixel units 1 in the second display region AA2, that is, a density of the pixel units 1 located in the first display region AA1 is smaller than that located in the second display region AA2 in order to increase the light transmittance of the first display region AA1.

In the first display region AA1, as shown in FIG. 7, the pixel unit 1 includes a plurality of first pixel unit rows 11 and a plurality of second pixel unit rows 12 which are alternately arranged in the column direction y. The first pixel unit row 11 includes a plurality of first pixel units 10 arranged along the row direction x. The second pixel unit row 12 includes a plurality of second pixel units 20 arranged along the row direction x. The first pixel unit 10 and the second pixel unit 20 are respectively represented in FIG. 7 in different patterns. In the row direction x, the first pixel unit 10 is located between two adjacent second pixel units 20, and the second pixel unit 20 is located between two adjacent first pixel units 10. That is, in the first display region AA1, the first pixel units 10 located in the first pixel unit row 11 and the second pixel units 20 located in the second pixel unit line 12 are located in different columns.

In an embodiment, the region having a same area shown in FIGS. 6-7 is taken as an example. In this region, the second display region AA2 shown in FIG. 6 includes 120 pixel units which are arranged in 10 rows and 12 columns.

Each row includes 12 pixel units and each column includes 10 pixel units. The first display region AA1 shown in FIG. 7 includes 15 pixel units which are arranged in 5 rows and 6 columns, including two first pixel unit rows 11 and three second pixel unit rows 12. Moreover, each first pixel unit row 11 includes three first pixel units 10, and each second pixel unit row 12 includes three second pixel units 20. The first column, the third column, and the fifth column each include three second pixel units 20. The second column, the fourth column, and the sixth column each include two first pixel units 10. When designing the pixel units of the first display region AA1 shown in FIG. 7, the design idea is as follows. First, the pixel units shown in FIG. 6 are removed by every row and column apart. Next, the pixel units are further removed by one-half pixel units per row and column, and the reserved pixel units and the removed pixel units are alternately arranged. For example, the arrangement manner of the pixel units shown in FIG. 7 can be considered as obtained by removing the second, fourth, and sixth pixel units in the first, third, and fifth rows of pixel units in FIG. 3, and removing the first, third, and fifth pixel units in the second, fourth, and sixth rows of pixel units in FIG. 3.

In an embodiment of the present disclosure, in the row direction x, the first pixel unit 10 is provided between two adjacent second pixel units 20, and the second pixel unit 20 is provided between two adjacent first pixel units 10, so that on the basis of reducing the density of the pixel unit 1 located in the first display region AA1 and improving the light transmittance of the first display region AA1, it is also possible to more dispersedly provide a limited number of pixel units 1 in the first display region, thereby avoiding the occurrence of granular sensation of the first display region AA1 during display.

Figure 8:
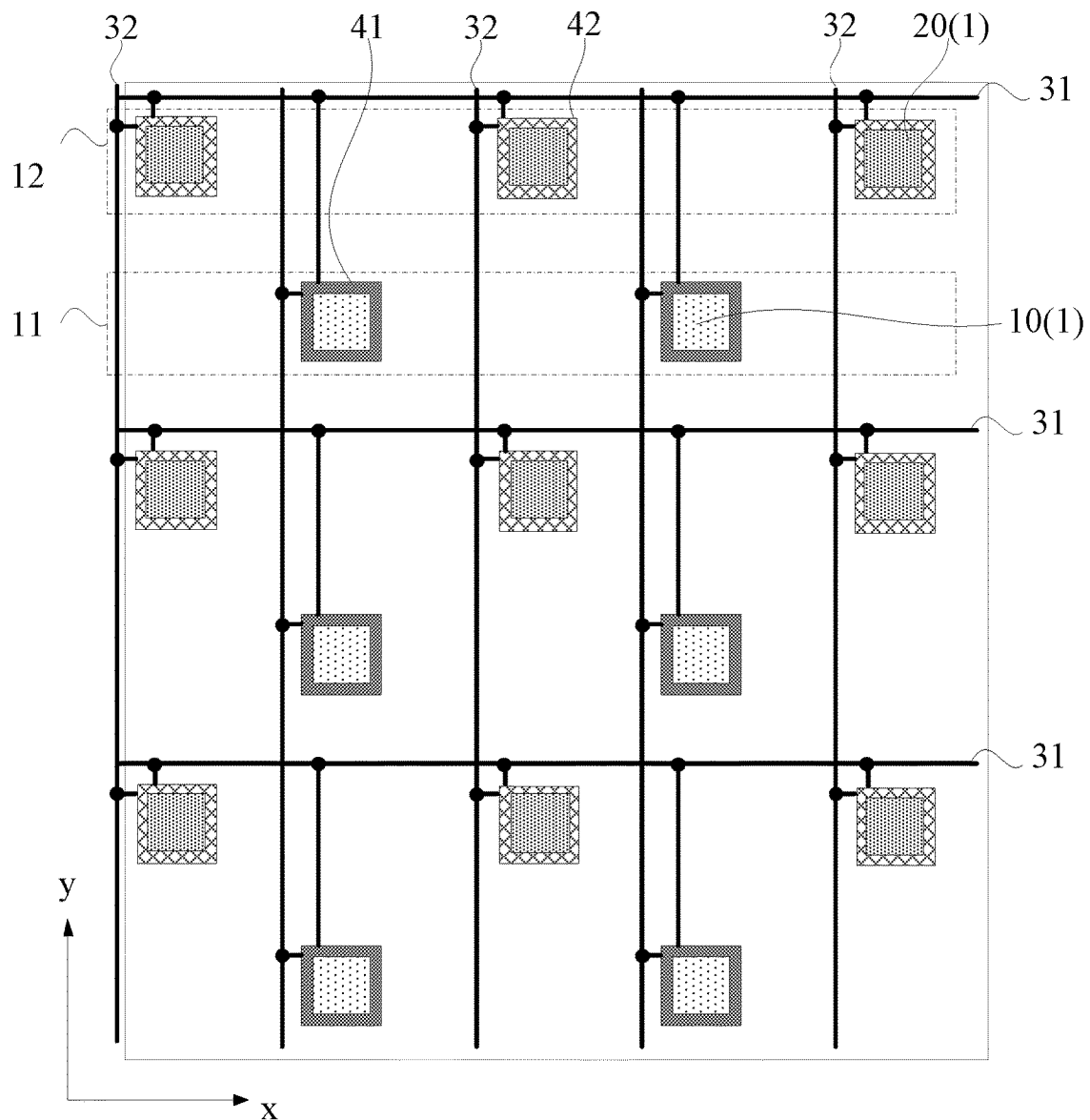
FIG. 8 is another enlarged schematic diagram showing a partial region of a first display region in FIG. 5.
Figure 9:
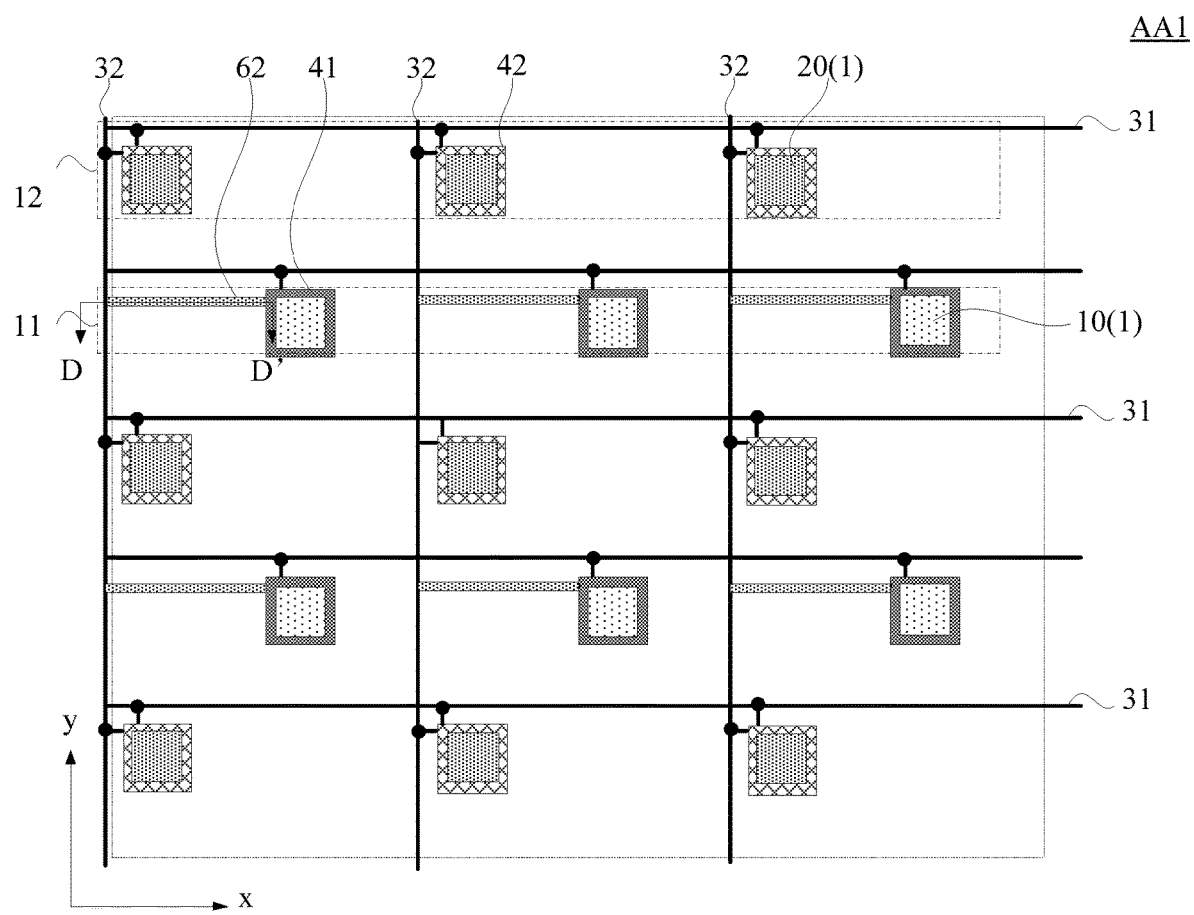
FIG. 9 is still another enlarged schematic diagram showing a partial region of a first display region in FIG. 5.

In an example of a representative embodiment, FIGS. 8 and 9 are another two enlarged schematic diagram showing a partial region of the first display region in FIG. 5, respectively. As shown in FIGS. 8-9, the first display region AA1 further includes a plurality of first signal lines 31 extending along the row direction x and arranged in the column direction y, and a plurality of second signal lines 32 extending in the column direction y and arranged along the row direction x. The first signal line 31 and the second signal line 32 intersect in an insulation manner. The first signal line 31 and the second signal line 32 intersect to define a plurality of first pixel circuits 41 and second pixel circuits 42 (areas of the first pixel circuit 41 and the second pixel circuit 42 are greater than areas of the first pixel unit 10 and the second pixel unit 20 shown in FIGS. 8-9, and the first pixel circuit 41 and the second pixel circuit 42 are shown in different patterns). The first pixel circuit 41 is electrically connected to the first pixel unit 10. The second pixel circuit 42 is electrically connected to the second pixel unit 20.

The inventors found that the arrangement manner shown in FIG. 7 used can alleviate the granular sensation of the display screen. In the related art, the pixel units in a same row are generally connected to a same first signal line, and the pixel units in a same column are connected to a same second signal line. It can be seen from FIGS. 3 and 7 that a number of rows and a number of columns of the pixel unit 1 in the arrangement manner shown in FIG. 7 are same as those shown in FIG. 3. Therefore, if the trace connection manner in the related art is adopted, the number of the first signal line and the number of the second signal line shown in FIGS. 3 and 7 are the same. When the pixel arrangement manner shown in FIG. 7 is adopted, the density of the pixel unit 1 is reduced, and the light transmittance is improved compared to the manner shown in FIG. 3. Compared with the manner shown in FIG. 4, the granular sensation of the display screen can be alleviated by the manner shown in FIG. 7. However, it is possible to improve light transmittance further, since one or more signal lines are usually formed of an opaque metal material in the related art.

Therefore, in order to further improve the light transmittance, when the pixel arrangement manner shown in FIG. 7 is adopted, the present disclosure proposes the schemes as shown in FIGS. 8 and 9.

In an example of a representative embodiment shown in FIG. 8, the first pixel circuit 41 and the second pixel circuit 42 are electrically connected to a same first signal line 31. The first pixel circuit 41 and the second pixel circuit 42 are electrically connected to different second signal lines 32. The first pixel unit 10 electrically connected to the first pixel circuit 41 and the second pixel unit 20 electrically connected to the second pixel circuit 42 are located in adjacent rows.

When the first display region AA1 shown in FIG. 8 is adopted for display, the first pixel circuit 41 and the second pixel circuit 42 can operate simultaneously under signal control of the first signal line 31. Since the first pixel circuit 41 and the second pixel circuit 42 are connected to different second signal lines 32, the first pixel circuit 41 and the second pixel circuit 42 can receive respective required signals by different second signal lines 32 at the same time. That is, such an arrangement in this embodiment can ensure the normal operation of the first pixel unit 10 and the second pixel unit 20 which are driven by the first pixel circuit 41 and the second pixel circuit 42. On the basis of this, the number of the first signal lines 31 in the first display region AA1 can be reduced as compared with the scheme of connecting the first pixel circuit 41 and the second pixel circuit 42 to different first signal lines 31, thereby further increasing the light transmittance of the first display region AA1.

In an example of another representative embodiment shown in FIG. 9, the first pixel circuit 41 and the second pixel circuit 42 are electrically connected to a same second signal line 32. The first pixel circuit 41 and the second pixel circuit 42 are electrically connected to different first signal lines 31. The first pixel unit 10 electrically connected to the first pixel circuit 41 and the second pixel unit 20 electrically connected to the second pixel circuit 42 are located in adjacent columns.

When the first display region AA1 shown in FIG. 9 is adopted for display, since the first pixel circuit 41 and the second pixel circuit 42 operate under control of different first signal lines 31, when the first signal line 31 electrically connected to the first pixel circuit 41 outputs an effective control level, the second signal line 32 can output a signal required by the first pixel circuit 41. When the first signal line 31 electrically connected to the second pixel circuit 42 outputs an effective control level, the signal on the second signal line 32 is switched to output a signal required by the second pixel circuit 42. That is, such an arrangement in this embodiment can cause a same second signal line 32 to transmit different signals to the first pixel circuit 41 and the second pixel circuit 42 which are connected to the second signal line 32 at different moments, ensuring that each of the first pixel unit 10 and the second pixel unit 20 which are driven by the pixel circuit 41 and the second pixel circuit 42 can operate normally. On the basis of this, compared with connecting the first pixel circuit 41 and the second pixel circuit 42 to different second signal lines 32, the number of the second signal lines 32 in the first display region AA1 can be reduced, thereby further increasing the light transmittance of the display region AA1.

As shown in FIGS. 7-9, in the first display region AA1, among the pixel units 1 in any four adjacent rows, the arrangement manners of first row of pixel units 1 and third row of pixel units 1 are the same, and the arrangement manners of second row of pixel units 1 and fourth row of pixel units 1 are the same. That is, the arrangement manners of the plurality of first pixel unit rows 11 are the same, and the arrangement manners of the plurality of second pixel unit rows 12 are the same. Among the pixel units 1 in any four adjacent columns, the arrangement manners of first column of pixel units 1 and third column of pixel units 1 are the same, and the arrangement manners of second column of pixel units 1 and fourth column of pixel units 1 are the same, so that the first display region AA1 may be repeatedly arranged in the above-described adjacent first pixel unit row 11 and second pixel unit row 12 as a repeating unit to form a pixel arrangement of the first display region AA1.

In an example of a representative embodiment, as shown in FIGS. 6-7, a distance L1 between two adjacent pixel units 1 located in a same row in the first display region AA1, and a distance L2 between two adjacent pixel units 1 located in a same row in the second display region AA2 satisfy: $3.5L2 \leq L1 \leq 4.5L2$. A distance L3 between two adjacent pixel units 1 in a same column in the first display region AA1, and a distance L4 between two adjacent pixel units 1 in a same column in the second display region AA2 satisfy: $3.5L4 \leq L3 \leq 4.5L4$. Therefore, the resolution of the first display region AA1 is not too low on the basis of increasing the light transmittance of the first display region AA1, thereby avoiding the occurrence of the granular sensation of the first display region AA1 during display.

In an example of a representative embodiment, the first signal line includes a first scan signal line S1, a second scan signal line S2, a reference voltage signal line VREF, and a light-emitting control signal line Emit which are arranged in the column direction y. The second signal line 32 includes a data signal line Data and a power voltage signal line PVDD which are arranged along the row direction x.

Figure 10:
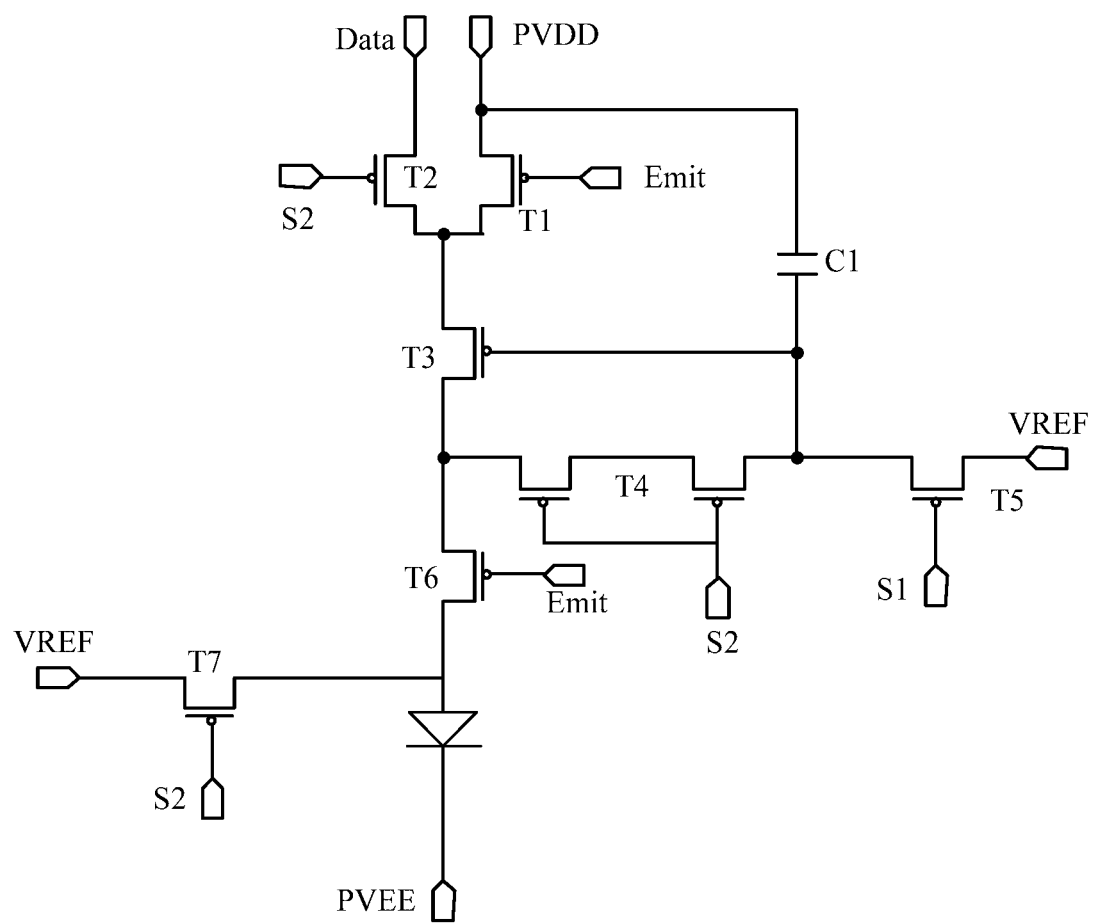
FIG. 10 is a schematic diagram showing a first pixel circuit according to an embodiment of the present disclosure.

FIG. 10 is a schematic diagram showing a first pixel circuit according to an example of a representative embodiment of the present disclosure. As shown in FIG. 10, the first pixel circuit 41 includes a first transistor T1, a second transistor T2, a third transistor T3, and a fourth transistor T4, the fifth transistor T5, the sixth transistor T6, and the seventh transistor T7. A gate electrode of the first transistor T1 and a gate electrode of the sixth transistor T6 each are connected to the light-emitting control signal line Emit. A first electrode of the first transistor T1 is connected to the power voltage signal line PVDD. A gate electrode of the second transistor T2, a gate electrode of the fourth transistor T4 and a gate electrode of the seventh transistor T7 each are connected to the second scanning signal line S2. A first electrode of the second transistor T2 is connected to the data signal line Data. A second electrode of the first transistor T1 and a second electrode of the second transistor T2 each are connected to a first electrode of the third transistor T3. A second electrode of the third transistor T3 is connected to a first electrode of the fourth transistor T4 and a first electrode of the sixth transistor T6. A gate electrode of the fifth transistor T5 is connected to the first scan signal line S1. A first electrode of the fifth transistor T5 and a first electrode of the seventh transistor T7 each are connected to the reference voltage signal line VREF. A second electrode of the fifth transistor T5 and a second electrode of the fourth transistor T4 each are connected to the gate electrode of the third transistor T3. A second electrode of the sixth transistor T6 and a second electrode of the seventh transistor T7 each are connected to the first pixel unit 10.

The following is a detailed description of an example of a representative scheme in which the first pixel circuit 41 and the second pixel circuit 42 are connected to a same first signal line 31 and a same second signal line 32, respectively.

Figure 11:
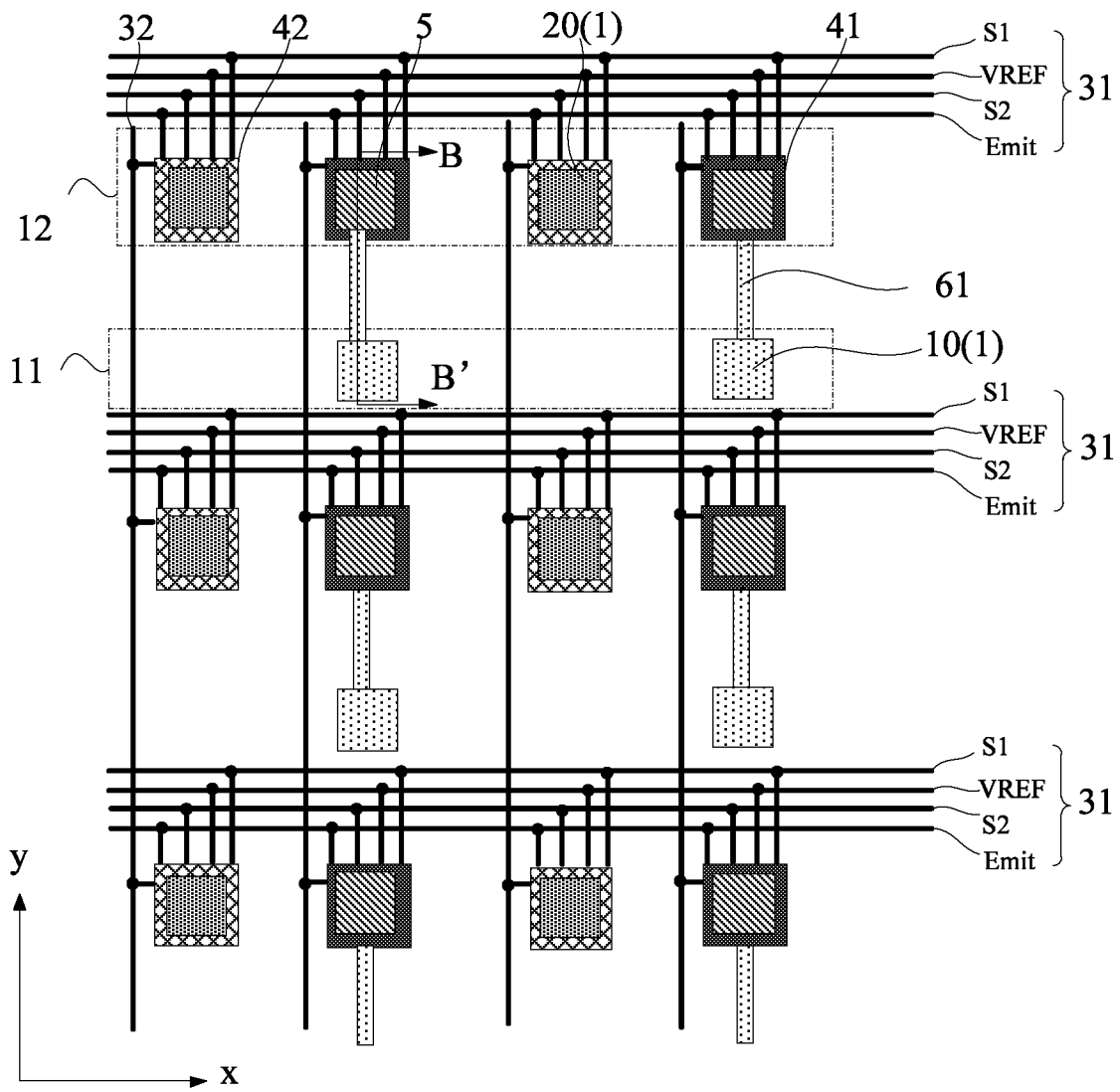
FIG. 11 is still another enlarged schematic diagram showing a partial region of a first display region in FIG. 5.

FIG. 11 is another enlarged schematic diagram showing a partial region of the first display region in FIG. 5. As shown in FIG. 11, the first pixel circuit 41 and the second pixel circuit 42 are connected to a same first signal line 31, and the first pixel unit 10 electrically connected to the first pixel circuit 41 and the second pixel unit 20 electrically connected to the second pixel circuit 42 are located in adjacent rows. When the first pixel circuit 41 and the second pixel circuit 42 adopts a circuit structure as shown in FIG. 10, and when the first signal line 31 includes the first scanning signal line S1, the second scanning signal line S2, the reference voltage signal line VREF, and the light-emitting control signal line Emit which are arranged along the column direction y, the first pixel circuit 41 and the second pixel circuit 42 are electrically connected to a same first signal line 31 means: the first pixel circuit 41 and the second pixel circuit 42 are electrically connected to a same first scan signal line S1, the first pixel circuit 41 and the second pixel circuit 42 are electrically connected to a same second scanning signal line S2, the first pixel circuit 41 and the second pixel circuit 42 are electrically connected to a same reference voltage signal line VREF, and the first pixel circuit 41 and the second pixel circuit 42 are electrically connected to a same light-emitting control signal line Emit.

When the first pixel circuit 41 and the second pixel circuit 42 are electrically connected to a same first signal line 31, and when the first pixel unit 10 electrically connected to the first pixel circuit 41 and the second pixel unit 20 electrically connected to the second pixel circuit 42 are located in adjacent rows, in this embodiment, the first pixel circuit 41 and the second pixel circuit 42 which are electrically connected to a same first signal line 31 are arranged along the row direction x. That is, in this embodiment, on the basis of FIG. 8, the position of the first pixel circuit 41 can be moved to separate the first pixel circuit 41 from the first pixel unit 10. In this way, when the first pixel circuit 41 and the second pixel circuit 42 are connected to a same first signal line 31, lengths of the connection traces connected between the first scan line S1 and the first pixel circuit 41, between the reference voltage signal line VREF and the first pixel circuit 41, between the second scan line S2 and the first pixel circuit 41, and between the light-emitting control signal line Emit and the first pixel circuit 41 can be reduced, thereby further increasing the light transmittance of the first display region AA1.

In an embodiment, as shown in FIG. 11, orthographic projections of the first pixel circuit 41 and the first pixel unit 10 on a plane where the display panel is located are not overlapped. Orthographic projections of the second pixel circuit 42 and the second pixel unit 20 on the plane where the display panel is located are overlapped. The display panel further includes a first connection line 61 configured to connect the first pixel circuit 41 with the first pixel unit 10. When the first pixel circuit 41 and the second pixel circuit 42 are arranged along the row direction x, and on the basis of reducing the length of the connection trace connected between the first signal line 31 and the first pixel circuit 41, the connection lines 61 is provided such that the first pixel circuit 41 can still drive to achieve normal operation of the first pixel unit 10.

Figure 12:
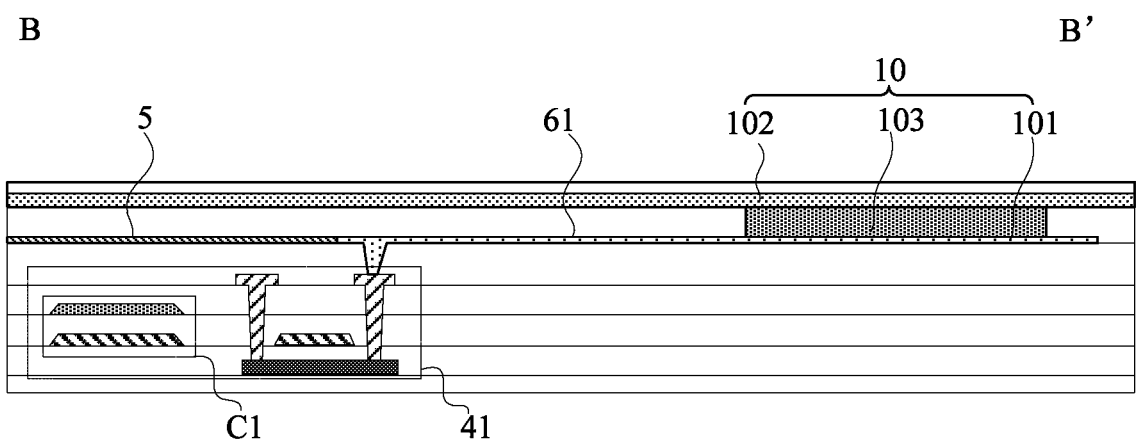
FIG. 12 is a schematic cross-sectional view along line BB' in FIG. 11.

In an embodiment, FIG. 12 is a schematic cross-sectional view along line BB' in FIG. 11. As shown in FIG. 12, the first pixel unit 10 includes a first electrode 101, a light-emitting layer 103, and a second electrode 102 which are stacked. The first pixel circuit 41 is connected to the first electrode 101 by the first connection line 61. The first connection line 61 is provided in a same layer as the first electrode 101. When the first connection line 61 and the first electrode 101 are connected, they can be connected directly without a punching operation in the display panel, so that the process is simple. Further, when the first connection line 61 is provided in a same layer as the first electrode 101, it is possible to avoid the arrangement of the first connection line 61 occupying the space of the other film layers. In the existed film layer structure of the display panel, the trace structure of the layer where the first electrode 101 is located is less. The first connection line 61 is provided on this layer, so that the process is simple, and the short-circuit possibility between the first connection line 61 and the existed trace in the display panel can also be reduced.

In an embodiment, as shown in FIG. 10, the first pixel circuit 41 further includes a storage capacitor C1. As shown in FIG. 11-12, the first display region AA1 further includes a compensation electrode 5 electrically connected to the first electrode 101 of the first pixel unit 10. Orthographic projections of the compensation electrode 5 and the storage capacitor C1 (not shown in FIG. 11) on the plane where the display panel is located are overlapped. In a display process of the first display region AA1, since orthographic projections of the second pixel circuit 42 and the second pixel unit 20 on the plane where the display panel is located are overlapped, a coupling capacitance is generated between the second pixel circuit 42 and the second pixel unit 20. In this embodiment, by providing the compensation electrode 5 electrically connected to the first electrode 101 of the first pixel unit 10 and by overlapping the compensation electrode 5 with the storage capacitor C1 included in the first pixel circuit 41, the coupling capacitance between the first pixel circuit 41 and the first pixel unit 10 can be increased in the case that orthographic projections of the first pixel circuit 41 and the first pixel unit 10 on the plane where the display panel is located are not overlapped, so that the coupling capacitance between the first pixel circuit 41 and the first pixel unit 10 tends to be uniform with the coupling capacitance between the second pixel circuit 42 and the second pixel unit 20, thereby the display effect of the first pixel unit 10 tending to be uniform with the display effect of the second pixel unit 20.

In an embodiment, as shown in FIG. 12, the compensation electrode 5 may be provided in a same layer with the first electrode 101, and the first connection line 61 configured to connect the first electrode 101 with the first pixel circuit 41 is reused as a connection line configured to connect the first electrode 101 with the compensation electrode 5, thereby reducing the number of traces in the first display region AA1.

Figure 13:
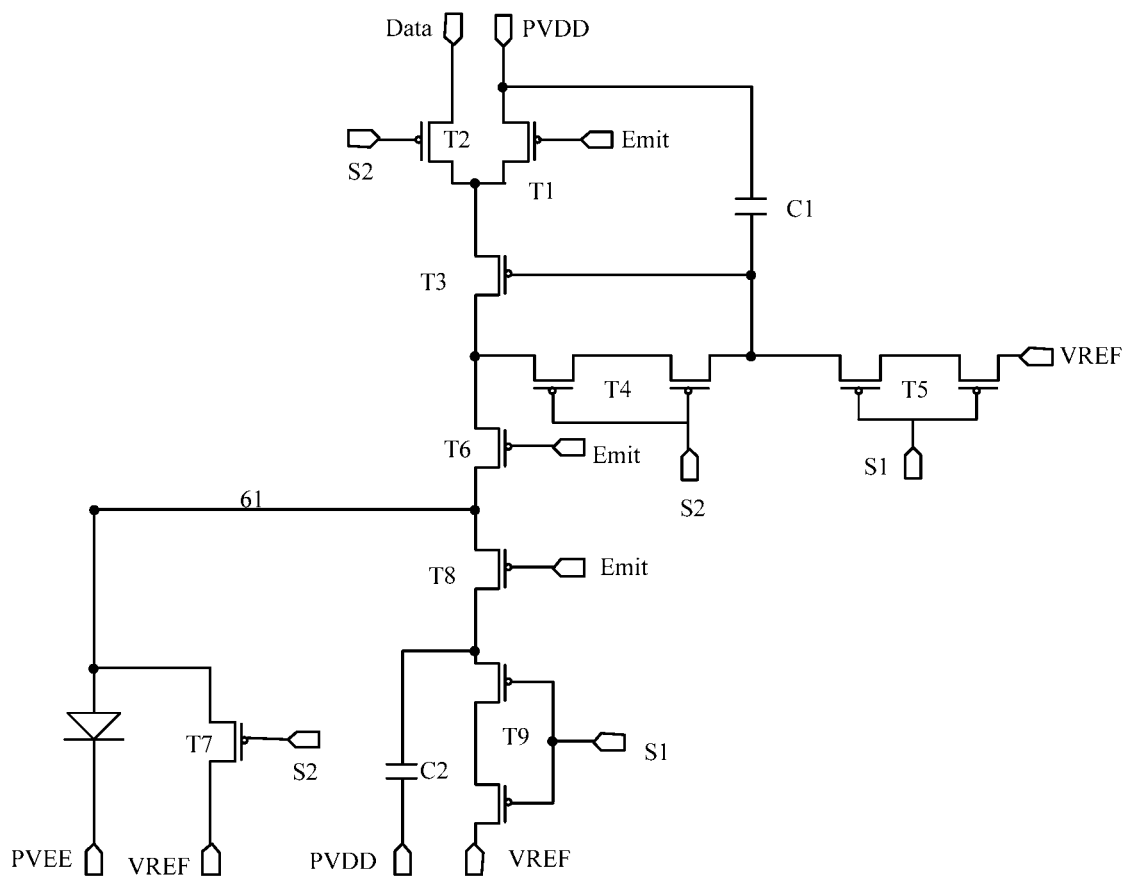
FIG. 13 is a schematic diagram of a first pixel circuit according to another representative embodiment of the present disclosure.

FIG. 13 is a schematic diagram of a first pixel circuit according to another embodiment of the present disclosure. As shown in FIG. 13, when the first pixel circuit 41 is separated from the first pixel unit 10, and when the first pixel circuit 41 is connected to the first pixel unit 10 by a first connection line 61, a stabilizing capacitor C2 is provided in the first pixel circuit 41. A first electrode plate of the stabilizing capacitor C2 is connected to the power voltage signal line PVDD, and a second electrode plate is connected to the reference voltage signal line VREF. In an embodiment of the present disclosure, a stabilizing capacitor C2 is provided in the first pixel circuit 41, and the two electrode plates of the stabilizing capacitor C2 are respectively connected to the power voltage signal line PVDD and the reference voltage signal line VREF, so that during luminance, the function of the capacitor C2 can ensure the stabilization of the potential on the first electrode 101 of the first pixel unit 10, thereby ensuring stable display of the first pixel unit 10.

As shown in FIG. 13, the first pixel circuit 41 further includes an eighth transistor T8 and a ninth transistor T9. A gate electrode of the eighth transistor T8 is connected to the light-emitting control signal line Emit. A first electrode of the eighth transistor is connected to the first electrode 101 of the first pixel unit 10 by the first connection line 61. A second electrode of the eighth transistor T8 is connected to a first electrode of the ninth transistor T9. A second electrode of the ninth transistor T9 is connected to the reference voltage signal line VREF, and a gate electrode of the ninth transistor T9 is connected to the first scanning signal line S1. The ninth transistor T9 is configured to initialize the stabilizing capacitor C2. During luminance, the light-emitting control signal line Emit transmits an effective level signal to turn on the eighth transistor T8, thereby achieving an electrical connection between the stabilizing capacitor C2 and the first electrode 101 of the first pixel unit 10.

Alternatively, in an embodiment, a first shielding metal may also be provided between the first connection line 61 and the second signal line 32, and the first shielding metal is connected to a fixed potential to avoid the signals on the second signal line 32 and the first connection line 61 interfering with each other.

In an embodiment, when the first connection line 61 is provided, the first connection line 61 and the second signal line 32 may be provided in different layers, and the orthographic projections of the first connection line 61 and the second signal line 32 on the plane where the display panel is located are not overlapped, so that a distance between the first connection line 61 and the second signal line 32 is increased and interference therebetween is reduced.

In an embodiment, as shown in FIG. 11, in the first display region AA1, a number of the first pixel unit 10 included in a row of first pixel units 10 is smaller than a number of the first pixel unit 10 included in a column of first pixel units 10. In this case, when the first pixel circuit 41 and the second pixel circuit 42 are connected to a same first signal line 31, compared with the scheme of connecting the first pixel circuit 41 and the second pixel circuit 42 to a same second signal line 32, the number of newly added first connection lines 61 can be reduced, and thus is advantageous for further increasing the light transmittance of the first display region AA1.

Figure 14:
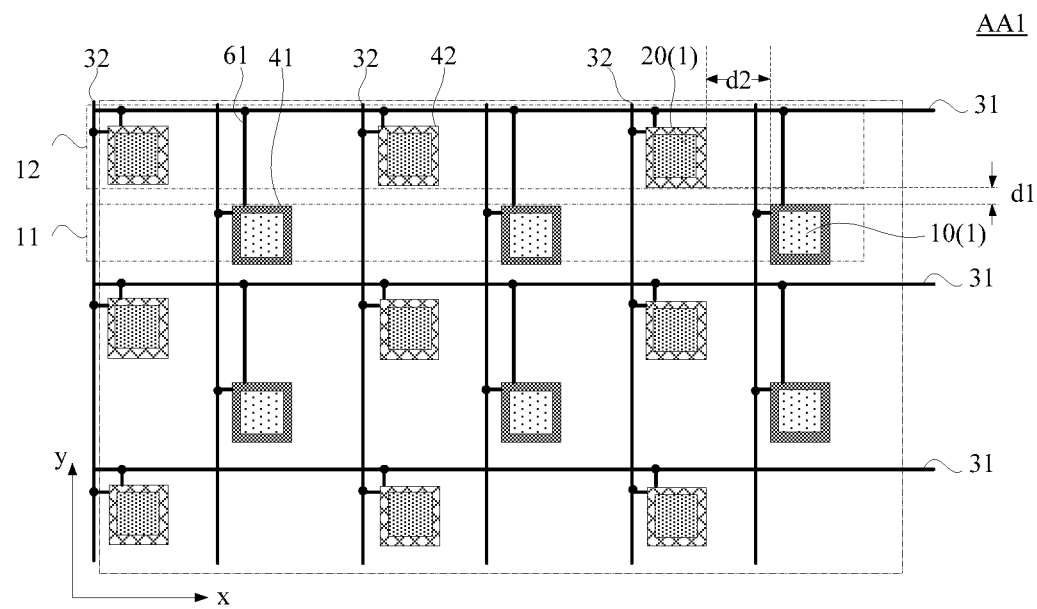
FIG. 14 is yet still another enlarged schematic diagram showing a partial region of a first display region in FIG. 5.

Alternatively, FIG. 14 is another enlarged schematic diagram showing a partial region of an embodiment the first display region in FIG. 5. As shown in FIG. 14, in the first display region AA1, a distance d1 between a row of first pixel units 10 and an adjacent row of second pixel units 20 is smaller than a distance d2 between a column of first pixel units 10 and an adjacent column of second pixel units 20. In this way, when the first pixel circuit 41 and the second pixel circuit 42 are connected to a same first signal line 31, compared with the scheme of connecting the first pixel circuit 41 and the second pixel circuit 42 to a same second signal line 32, the length of newly added first connection lines 61 can be reduced as much as possible, and thus is advantageous for further increasing the light transmittance of the first display region AA1.

The above is an explanation of the embodiments of the present disclosure by electrically connecting the first pixel circuit 41 and the second pixel circuit 42 to a same first signal line 31. The scheme of electrically connecting the first pixel circuit 41 and the second pixel circuit 42 to a same second signal line 32 will be described below in detail.

Figure 15:
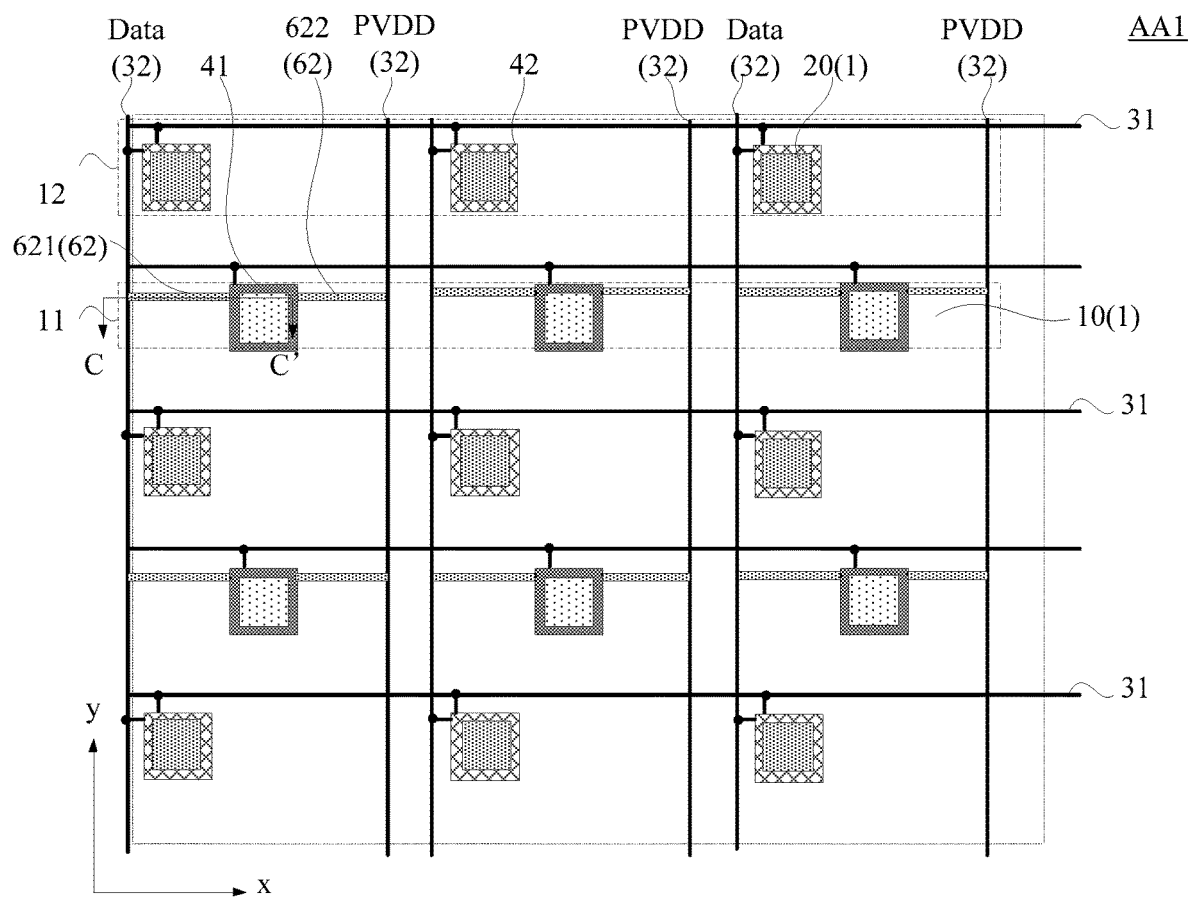
FIG. 15 is yet still another enlarged schematic diagram showing a partial region of a first display region in FIG. 5.

FIG. 15 is still another enlarged schematic diagram showing an embodiment of a partial region of the first display region in FIG. 5. As shown in FIG. 15, when the first pixel circuit 41 adopts a circuit structure as shown in FIG. 10, and when the second signal line 32 includes the data signal line Data and the power voltage signal line PVDD that are arranged along the row direction x, the first pixel circuit 41 and the second pixel circuit 42 are electrically connected to a same second signal line 32, which means the first pixel circuit 41 and the second pixel circuit 42 are electrically connected to a same data signal line Data, and the first pixel circuit 41 and the second pixel circuit 42 are electrically connected to a same power voltage signal line PVDD.

As shown in FIG. 15, when the first pixel circuit 41 and the second pixel circuit 42 are electrically connected to a same second signal line 32, the first pixel unit 10 electrically connected to the first pixel circuit 41 and the second pixel unit 20 electrically connected to the second pixel circuit 42 are located in adjacent columns, orthographic projections of the first pixel circuit 41 and the first pixel unit 10 on a plane where the display panel is located are overlapped, and orthographic projections of the second pixel circuit 42 and the second pixel unit 20 on a plane where the display panel is located are overlapped. The number of second signal lines 32 is smaller than the number of first signal lines 31, therefore, when the first pixel circuit 41 and the second pixel circuit 42 are electrically connected to a same second signal line 32, in this embodiment, the first pixel unit 10 and the first pixel circuit 41 may be provided to be overlapped, thereby avoiding additionally providing a connection line configured to connect the first pixel unit 10 with the first pixel circuit 41. Moreover, in this case, since the number of the second signal lines 32 is smaller than the number of the first signal lines 31, the number of the newly added connection line configured to connect the first pixel circuit 41 and the second signal line 32 is also small, so that there is less influence on the light transmittance of the first display region AA1.

In an embodiment, as shown in FIG. 15, the first display region further includes a second connection line 62 configured to electrically connect the first pixel circuit 41 with the second signal line 32, so that on the basis of reducing the number of the second signal lines 32, the first pixel circuit 41 can receive the signal of the second signal line 32 through the second connection line 62, thereby achieving normal operation of the first pixel circuit 41.

Figure 16:
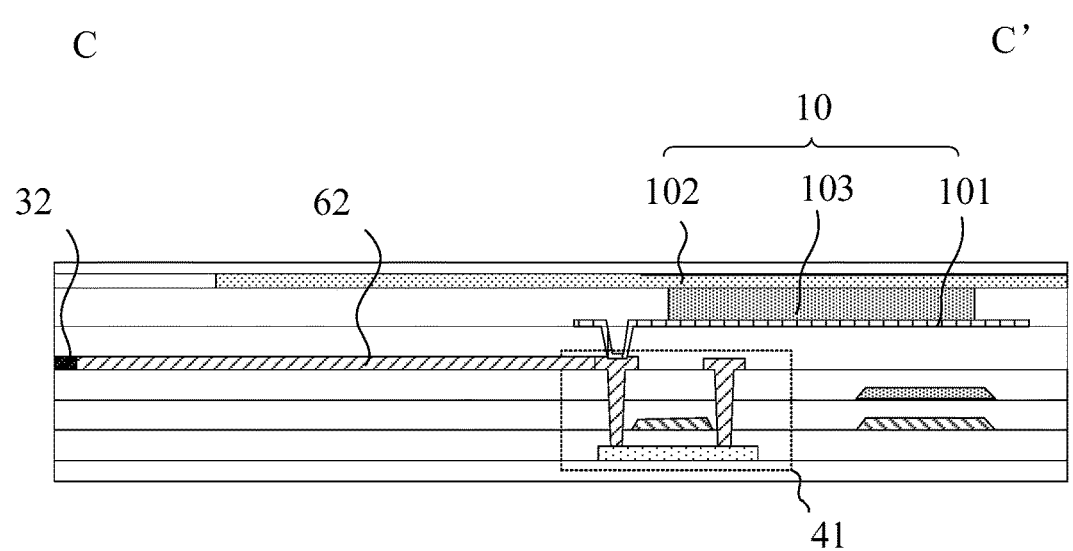
FIG. 16 is a schematic cross-sectional view along line CC' in FIG. 15.

FIG. 16 is a schematic cross-sectional view along line CC' in FIG. 15. As shown in FIG. 16, the second connection line 62 is provided in a same layer with the second signal line 32. The second connection line 62 can be directly connected to the second signal line 32 without punching operation in the display panel when connecting therebetween is desired, therefore the process is simple.

As shown in FIG. 15, the data signal line Data, the first pixel circuit 41, and the power voltage signal line PVDD are sequentially arranged along the row direction x. The second connection line 62 includes a first connection sub-line 621 and a second connection sub-line 622. The first connection sub-line 621 is electrically connected to the first pixel circuit 41 and the data signal line Data adjacent to the first pixel circuit 41. Moreover, the first connection sub-line 621 is located between the first pixel circuit 41 and the data signal line Data adjacent to the first pixel circuit. 41, so that the intersection between the first connection sub-line 621 and the power voltage signal line PVDD can be avoided, thereby avoiding interference between the signals transmitted therefrom, and ensuring accuracy of the signal transmitted on the first connection sub-line 621 and the power voltage signal line PVDD.

The second connection sub-line 622 is electrically connected to the first pixel circuit 41 and the power voltage signal line PVDD adjacent to the first pixel circuit 41, and is located between the first pixel circuit 41 and the power voltage signal line PVDD adjacent to the first pixel circuit 41, so that the intersection between the second connection sub-line 622 and the data signal line Data can be avoided, thereby avoiding interference between the signals transmitted therefrom, and ensuring accuracy of the signal transmitted on the second connection sub-line 622 and the data signal line Data.

In an embodiment, the first display region AA1 is further provided with a second shielding metal located between the second connection line 62 and the first signal line 31, and the second shielding metal is connected to a fixed potential, thereby avoiding the interference between the second connection line 62 and the first signal line 31.

Alternatively, when the second connection line 62 is provided, the second connection line 62 and the first signal line 31 may be provided in different layers, and the orthographic projections of the second connection line 62 and the first signal line 31 on the plane where the display panel is located are not overlapped, so that the distance between the second connection line 62 and the first signal line 31 can be increased, thereby reducing the interference therebetween.

In an embodiment, as shown in FIGS. 9 and 15, in the first display region AA1, a number of the first pixel unit 10 included in a column of first pixel units 10 is smaller than a number of the first pixel unit 10 included in a row of first pixel units 10. In this case, when the first pixel circuit 41 and the second pixel circuit 42 are connected to a same second signal line 32, compared with the scheme of connecting the first pixel circuit 41 and the second pixel circuit 42 to a same first signal line 31, the number of newly added second connection lines 62 can be reduced, and thus is advantageous for further increasing the light transmittance of the first display region AA1.

Figure 17:
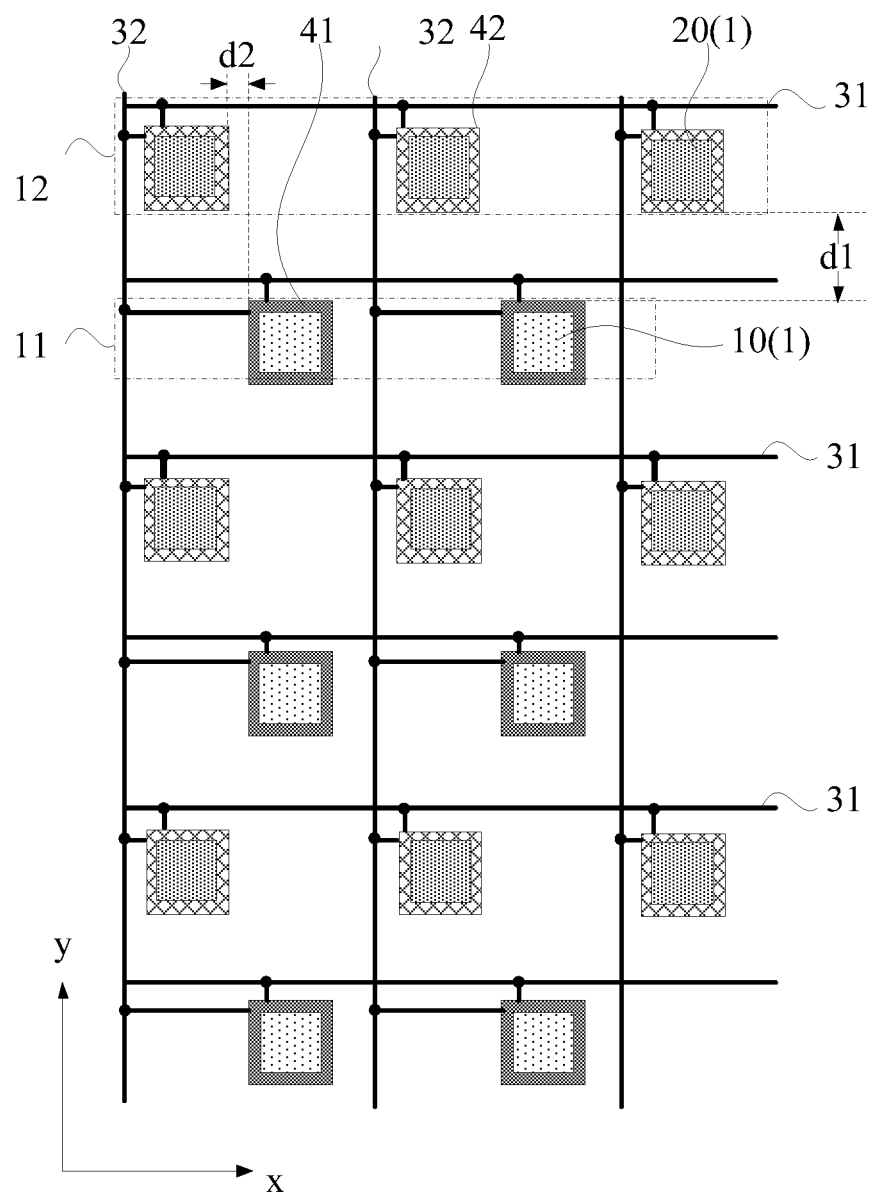
FIG. 17 is yet still another enlarged schematic diagram showing a portion of a first display region in FIG. 5.

FIG. 17 is another enlarged schematic diagram showing an embodiment of a portion of the first display region in FIG. 5. Alternatively, as shown in FIG. 17, the first display region AA1, a distance d2 between a column of first pixel units 10 and an adjacent column of second pixel units 20 is smaller than a distance d1 between a row of first pixel units 10 and an adjacent row of second pixel units 20. In this way, when the first pixel circuit 41 and the second pixel circuit 42 are connected to a same second signal line 32, compared with the scheme of connecting the first pixel circuit 41 and the second pixel circuit 42 to a same first signal line 31, the length of newly added second connection lines 62 can be reduced as much as possible, and thus is advantageous for further increasing the light transmittance of the first display region AA1.

Figure 18:
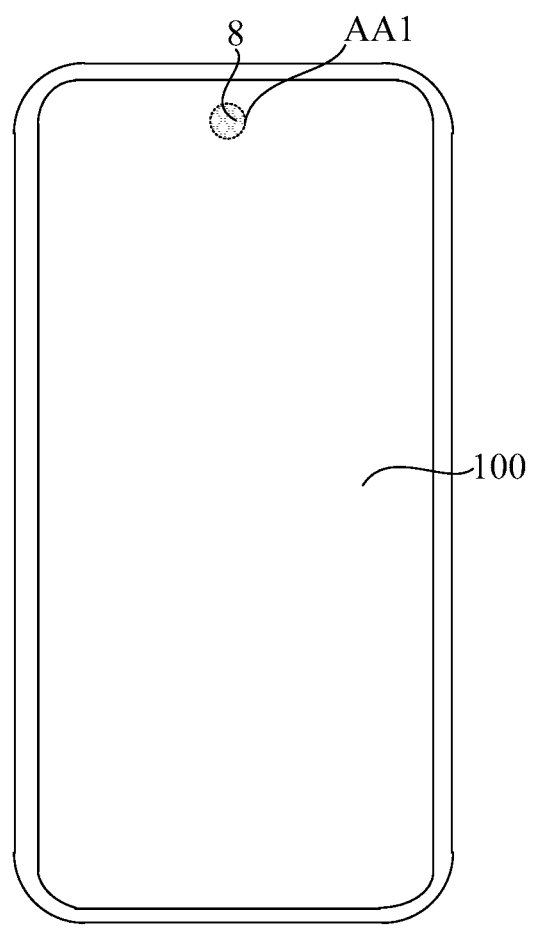
FIG. 18 is a schematic diagram showing a display device according to a representative embodiment of the present disclosure.

The present disclosure further provides a display device. FIG. 18 is a schematic diagram showing a display device according to an embodiment of the present disclosure. As shown in FIG. 18, the display device includes a light sensation unit 8 and the display panel 100 as described above. An orthographic projection of the light sensation unit 8 on the plane where the display panel is located is within the first display region AA1. The specific structure of the display panel 100 has been described in detail in the above embodiments, which is not elaborated herein again. It is appreciated that, the display device shown in FIG. 18 is merely illustrative, and the display device may be any electronic device having a display function such as a mobile phone, a tablet computer, a laptop computer, an electronic paper book, or a television.

In the display device provided by the embodiments of the present disclosure, the light transmittance of the first display region is increased by causing the density of the pixel unit located in the first display region to be smaller than the density of the pixel unit located in the second display region. On the basis of this, along the row direction, the present disclosure sets the first pixel unit between two adjacent second pixel units and sets the second pixel unit between two adjacent first pixel units, so that a limited number of pixel units can be provided more dispersedly in the first display region, thereby avoiding the occurrence of granular sensation of the first display region during display.

In addition, in the embodiments of the present disclosure, by electrically connecting the first pixel circuit and the second pixel circuit to a same first signal line, the first pixel circuit and the second pixel circuit are electrically connected to different second signal lines. The first pixel unit electrically connected to the first pixel circuit and the second pixel unit electrically connected to the second pixel circuit are located in adjacent rows, on the basis of the normal operation of the first pixel unit and the second pixel unit which are driven by the first pixel circuit and the second pixel circuit, compared with the scheme of connecting the first pixel circuit and the second pixel circuit to different first signal lines, the number of the first signal lines in the first display region can be reduced, thereby further increasing the light transmittance of the first display region.

Alternatively, in the embodiments of the present disclosure, by electrically connecting the first pixel circuit and the second pixel circuit to a same second signal line, the first pixel circuit and the second pixel circuit are connected to different first signal lines. The first pixel unit electrically connected to the first pixel circuit and the second pixel unit electrically connected to the second pixel circuit are located in adjacent columns, on the basis of the normal operation of the first pixel unit and the second pixel unit which are driven by the first pixel circuit and the second pixel circuit, compared with the scheme of connecting the first pixel circuit and the second pixel circuit to different second signal lines, the number of the second signal lines in the first display region can be reduced, thereby further increasing the light transmittance of the first display region.

The above are merely preferred embodiments of the present disclosure, which, as mentioned above, are not used to limit the present disclosure. Whatever within the principles of the present disclosure, including any modification, equivalent substitution, improvement, etc., shall fall into the protection scope of the present disclosure.

What is claimed is:

1. A display panel, comprising:
a display region; and
a non-display region;
wherein the display region comprises a plurality of pixel units arranged in an array of rows extending along a row direction and of columns extending along a column direction;
wherein the display region comprises a first display region and a second display region at least partially surrounding the first display region;
wherein a density of the pixel units in the first display region is smaller than a density of the pixel units in the second display region;
wherein the plurality of pixel units comprises a plurality of first pixel unit rows and a plurality of second pixel unit rows that are alternately arranged along the column direction and located in the first display region; each of the plurality of first pixel unit rows comprises a plurality of first pixel units arranged along the row direction, and each of the plurality of second pixel unit rows comprises a plurality of second pixel units arranged along the row direction; along the row direction, at least one of the plurality of first pixel units is located between two adjacent second pixel units of the plurality of second pixel units, and at least one of the plurality of second pixel units is located between two adjacent first pixel units of the plurality of first pixel units;
wherein the first display region further comprises a plurality of first signal lines extending along the row direction and arranged along the column direction, and a plurality of second signal lines extending along the column direction and arranged along the row direction; wherein the plurality of first signal lines and the plurality of second signal lines intersect to define a plurality of first pixel circuits and a plurality of second pixel circuits, each of the plurality of first pixel circuits is electrically connected to one of the plurality of first pixel units, and each of the plurality of second pixel circuits is electrically connected to one of the plurality of second pixel units; and
wherein
at least one of the plurality of first pixel circuits and at least one of the plurality of second pixel circuits are electrically connected to a same first signal line of the plurality of first signal lines and to different second signal lines of the plurality of second signal lines, and at least one of the plurality of first pixel units electrically connected to the at least one of the plurality of first pixel circuits and at least one of the plurality of second pixel units electrically connected to the at least one of the plurality of second pixel circuits are located in adjacent rows of the array; or,
at least one of the plurality of first pixel circuits and at least one of the plurality of second pixel circuits are electrically connected to a same second signal line of the plurality of second signal lines and to different first signal lines of the plurality of first signal lines, and at least one of the plurality of first pixel units electrically connected to the at least one of the plurality of first pixel circuits and at least one of the plurality of second pixel units electrically connected to the at least one of the plurality of second pixel circuits are located in adjacent columns of the array.

2. The display panel according to claim 1, wherein
at least one of the plurality of first pixel circuits and at least one of the plurality of second pixel circuits are electrically connected to a same first signal line of the plurality of first signal lines, and at least one of the plurality of first pixel units electrically connected to the at least one of the plurality of first pixel circuits and at least one of the plurality of second pixel units electrically connected to the at least one of the plurality of second pixel circuits are located in adjacent rows of the array; and
the at least one of the plurality of first pixel circuits and the at least one of the plurality of second pixel circuits which are electrically connected to the same first signal line of the plurality of first signal lines are arranged along the row direction.

3. The display panel according to claim 2, wherein
an orthographic projection of the one of the plurality of first pixel circuits on a plane of the display panel does not overlap an orthographic projection of the one of the plurality of first pixel units on the plane of the display panel; and an orthographic projection of the one of the plurality of second pixel circuits on the plane of the display panel overlaps an orthographic projection of the one of the plurality of second pixel units on the plane of the display panel; and
the display panel further comprises a first connection line configured to connect the one of the plurality of first pixel circuits with the one of the plurality of first pixel units.

4. The display panel according to claim 3, wherein
each of the plurality of first pixel units comprises a first electrode, a light-emitting layer and a second electrode that are stacked, and wherein one of the plurality of first pixel circuits is connected to the first electrode; and
the first connection line is provided in a same layer with the first electrode.

5. The display panel according to claim 3, wherein
each of the plurality of first pixel units comprises a first electrode, a light-emitting layer and a second electrode that are stacked, wherein one of the plurality of first pixel circuits is connected to the first electrode; and wherein each of the plurality of first pixel circuits comprises a storage capacitor; and
the first display region further comprises a compensation electrode electrically connected to the first electrode of the first pixel unit, and an orthographic projection of the compensation electrode on the plane of the display panel overlaps an orthographic projection of the storage capacitor on the plane of the display panel.

6. The display panel according to claim 2, further comprising a plurality of power voltage signal lines and a plurality of reference voltage signal lines; and
wherein each of the plurality of first pixel circuits comprises a stabilizing capacitor having a first plate connected to one of the plurality of power voltage signal lines and a second plate connected to one of the plurality of reference voltage signal lines.

7. The display panel according to claim 2, wherein in the first display region, a number of first pixel units in a row of first pixel units is smaller than a number of first pixel units in a column of first pixel units.

8. The display panel according to claim 2, wherein in the first display region, a distance between a row of first pixel units and an adjacent row of second pixel units is smaller than a distance between a column of first pixel units and an adjacent column of second pixel units.

9. The display panel according to claim 1, wherein
at least one of the plurality of first pixel circuits and at least one of the plurality of second pixel circuits are electrically connected to a same second signal line of the plurality of second signal lines, at least one of the plurality of first pixel units electrically connected to the at least one of the plurality of first pixel circuits and at least one of the plurality of second pixel units electrically connected to the at least one of the plurality of second pixel circuits are located in adjacent columns;
an orthographic projection of the at least one of the plurality of first pixel circuits on a plane of the display panel overlaps an orthographic projection of the at least one of the plurality of first pixel units electrically connected to the at least one of the plurality of first pixel circuits on the plane of the display panel; and
an orthographic projection of the at least one of the plurality of second pixel circuits on the plane of the display panel overlaps an orthographic projection of the at least one of the plurality of second pixel units electrically connected to the at least one of the plurality of second pixel circuits on the plane of the display panel.

10. The display panel according to claim 9, further comprising a second connection line configured to electrically connect the at least one of the plurality of first pixel circuits with the one of the plurality of second signal lines.

11. The display panel according to claim 10, wherein the second connection line is provided in a same layer with the one of the plurality of second signal lines.

12. The display panel according to claim 9, wherein in the first display region, a number of first pixel units in one column of first pixel units is smaller than a number of first pixel units in one row of first pixel units.

13. The display panel according to claim 9, wherein in the first display region, a distance between a column of first pixel units and an adjacent column of second pixel units is smaller than a distance between a row of first pixel units and an adjacent row of second pixel units.

14. The display panel according to claim 10, wherein
the plurality of second signal lines comprises data signal lines and power voltage signal lines that are alternately arranged along the row direction;
one of the data signal lines, one of the plurality of first pixel circuits and one of the power voltage signal lines are sequentially arranged along the row direction;
the second connection line comprises a first connection sub-line and a second connection sub-line;
the first connection sub-line electrically connects the one of the plurality of first pixel circuits and one of the data signal lines adjacent to the one of the plurality of first pixel circuits, and is located between the one of the plurality of first pixel circuits and the one of the data signal lines adjacent to the one of the plurality of first pixel circuits; and
the second connection sub-line electrically connects the one of the plurality of first pixel circuits and one of the power voltage signal lines adjacent to the one of the plurality of first pixel circuit, and is located between the one of the plurality of first pixel circuits and the one of the power voltage signal lines adjacent to the one of the plurality of first pixel circuits.

15. The display panel according to claim 1, wherein
each of the plurality of first signal lines comprises a first scan signal line, a second scan signal line, a reference voltage signal line, and a light-emitting control signal line that are arranged in the column direction;
each of the plurality of second signal lines comprises a data signal line and a power voltage signal line that are arranged along the row direction;
each of the plurality of first pixel circuits comprises a first transistor, a second transistor, a third transistor, a fourth transistor, a fifth transistor, a sixth transistor, and a seventh transistor; and
a gate electrode of the first transistor and a gate electrode of the sixth transistor are connected to the light-emitting control signal line, a first electrode of the first transistor is connected to the power voltage signal line, a gate electrode of the second transistor, a gate electrode of the fourth transistor and a gate electrode of the seventh transistor are connected to the second scan signal line, a first electrode of the second transistor is connected to the data signal line; a second electrode of the first transistor and a second electrode of the second transistor are connected to a first electrode of the third transistor, a second electrode of the third transistor is connected to a first electrode of the fourth transistor and to a first electrode of the sixth transistor, a gate electrode of the fifth transistor is connected to the first scan signal line, a first electrode of the fifth transistor and a first electrode of the seventh transistor are connected to the reference voltage signal line, a second electrode of the fifth transistor and a second electrode of the fourth transistor are connected to a gate electrode of the third transistor, and a second electrode of the sixth transistor and a second electrode of the seventh transistor are connected to one of the plurality of first pixel units.

16. The display panel according to claim 1, wherein in the first display region, among pixel units of the plurality of pixel units in any four adjacent rows including a first row, a second row, a third row, and a fourth row, the pixel units in the first row are arranged in a same manner as the pixel units in the third row, and the pixel units in the second row are arranged in a same manner as the pixel units in the fourth row; and among pixel units of the plurality of pixel units in adjacent any four adjacent columns including first to fourth columns, the pixel units in the first column are arranged in a same manner as the pixel units in the third column, and the pixel units in the second column are arranged in a same manner as the pixel units in the fourth column.

17. The display panel according to claim 1, wherein a distance L1 between two adjacent pixel units of the plurality of pixel units located in a same row in the first display region and a distance L2 between two adjacent pixel units of the plurality of pixel units located in a same row in the second display region satisfy:
$3.5L2 \leq L1 \leq 4.5L2$; and
a distance L3 between two adjacent pixel units of the plurality of pixel units located in in a same column in the first display region and a distance L4 between two adjacent pixel units of the plurality of pixel units located in in a same column in the second display region satisfy:
$3.5L4 \leq L3 \leq 4.5L4$.

18. A display device, comprising a light sensation unit and a display panel, wherein the display panel comprises:
a display region; and
a non-display region;
wherein the display region comprises a plurality of pixel units arranged in an array along a row direction and a column direction;
wherein the display region comprises a first display region and a second display region at least partially surrounding the first display region;
wherein a density of pixel units in the first display region is smaller than a density of pixel units in the second display region;
wherein the plurality of pixel units comprises a plurality of first pixel unit rows and a plurality of second pixel unit rows that are alternately arranged along the column direction and located in the first display region; each of the plurality of first pixel unit rows comprises a plurality of first pixel units arranged along the row direction, and each of the plurality of second pixel unit rows comprises a plurality of second pixel units arranged along the row direction; along the row direction, at least one of the plurality of first pixel units is located between two adjacent second pixel units of the plurality of second pixel units, and at least one of the plurality of second pixel units is located between two adjacent first pixel units of the plurality of first pixel units;
wherein the first display region further comprises a plurality of first signal lines extending along the row direction and arranged along the column direction, and a plurality of second signal lines extending along the column direction and arranged along the row direction; wherein the plurality of first signal lines and the plurality of second signal lines intersect to define a plurality of first pixel circuits and a plurality of second pixel circuits, each of the plurality of first pixel circuits is electrically connected to one of the plurality of first pixel units, and each of the plurality of second pixel circuits is electrically connected to one of the plurality of second pixel units;
wherein
at least one of the plurality of first pixel circuits and at least one of the plurality of second pixel circuits are electrically connected to a same first signal line of the plurality of first signal lines and different second signal lines of the plurality of second signal lines, and at least one of the plurality of first pixel units electrically connected to the at least one of the plurality of first pixel circuits and at least one of the plurality of second pixel units electrically connected to the at least one of the plurality of second pixel circuits are located in adjacent rows of the array; or
at least one of the plurality of first pixel circuits and at least one of the plurality of second pixel circuits are electrically connected to a same second signal line of the plurality of second signal lines and different first signal lines of the plurality of first signal lines, and at least one of the plurality of first pixel units electrically connected to the at least one of the plurality of first pixel circuits and at least one of the plurality of second pixel units electrically connected to the at least one of the plurality of second pixel circuits are located in adjacent columns of the array, and
wherein an orthographic projection of the light sensation unit on a plane of the display panel is located within the first display region.

19. The display device according to claim 18, wherein in the first display region, among pixel units of the plurality of pixel units in any four adjacent rows including a first row, a second row, a third row, and a fourth row, the pixel units in the first row are arranged in a same manner as the pixel units in the third row, and the pixel units in the second row are arranged in a same manner as the pixel units in the fourth row; and
among pixel units of the plurality of pixel units in adjacent any four adjacent columns including a first column, a second column, a third column, and a fourth column, the pixel units in the first column are arranged in a same manner as the pixel units in the third column, and the pixel units in the second column are arranged in a same manner as the pixel units in the fourth column.

20. The display device according to claim 18, wherein a distance L1 between two adjacent pixel units of the plurality of pixel units located in a same row in the first display region and a distance L2 between two adjacent pixel units of the plurality of pixel units located in a same row in the second display region satisfy:
$3.5L2 \leq L1 \leq 4.5L2$; and a distance L3 between two adjacent pixel units of the plurality of pixel units located in in a same column in the first display region and a distance L4 between two adjacent pixel units of the plurality of pixel units located in in a same column in the second display region satisfy:

$3.5L4 \leq L3 \leq 4.5L4$.

\* \* \* \* \*

UNITED STATES PATENT AND TRADEMARK OFFICE
CERTIFICATE OF CORRECTION

PATENT NO. : 11,054,859 B2
APPLICATION NO. : 16/721699
DATED : July 6, 2021
INVENTOR(S) : Ma et al.

Page 1 of 1

It is certified that error appears in the above-identified patent and that said Letters Patent is hereby corrected as shown below:

In the Claims

| Column | Line | |
|---|---|---|
| 17 | 26 | change "in adjacent any" to -- in any -- |
| 17 | 40 | change "in in a" to -- in a -- |
| 17 | 43 | change "in in a" to -- in a -- |
| 18 | 54-55 | change "in adjacent any" to -- in any -- |
| 19 | 2 | change "in in a" to -- in a -- |
| 19 | 5 | change "in in a" to -- in a -- |

Signed and Sealed this
Second Day of August, 2022

Katherine Kelly Vidal
*Director of the United States Patent and Trademark Office*